(12) United States Patent
Park et al.

(10) Patent No.: US 9,305,830 B2
(45) Date of Patent: *Apr. 5, 2016

(54) METHODS OF FABRICATING SEMICONDUCTOR DEVICES

(71) Applicant: Samsung Electronics Co., Ltd., Suwon-si, Gyeonggi-do (KR)

(72) Inventors: Sang-yong Park, Suwon-si (KR); Woon-kyung Lee, Seongnam-si (KR); Jin-taek Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/535,609

(22) Filed: Nov. 7, 2014

(65) Prior Publication Data

US 2015/0064902 A1 Mar. 5, 2015

Related U.S. Application Data

(62) Division of application No. 13/418,585, filed on Mar. 13, 2012, now Pat. No. 8,906,805.

(30) Foreign Application Priority Data

Mar. 15, 2011 (KR) ........................ 10-2011-0022884

(51) Int. Cl.
*H01L 21/768* (2006.01)
*H01L 21/311* (2006.01)
*H01L 29/788* (2006.01)
*H01L 29/792* (2006.01)
*H01L 27/115* (2006.01)

(52) U.S. Cl.
CPC ........ *H01L 21/76802* (2013.01); *H01L 21/311* (2013.01); *H01L 21/76838* (2013.01);

(Continued)

(58) Field of Classification Search
CPC ............ H01L 21/311; H01L 21/76802; H01L 21/76838; H01L 27/11519; H01L 27/11524; H01L 27/11548; H01L 27/11556; H01L 27/11565; H01L 27/1157; H01L 27/11575; H01L 27/11582; H01L 29/7889; H01L 29/7926

See application file for complete search history.

(56) References Cited

U.S. PATENT DOCUMENTS 7,539,056 B2 5/2009 Katsumata et al.
7,989,880 B2 * 8/2011 Wada et al. ................... 257/329

(Continued)

FOREIGN PATENT DOCUMENTS

JP 2008-192708 8/2008
JP 2009-135324 6/2009
KR 1020100097066 A 9/2010

*Primary Examiner* — Mary Wilczewski
(74) *Attorney, Agent, or Firm* — Myers Bigel & Sibley, P.A.

(57) ABSTRACT

A method of fabricating a semiconductor device includes forming a stacked structure in which $2^n$ (here, n is an integer which is 2 or more) deposited sacrificial layers and $2^n$ deposited insulating layers disposed on the $2^n$ deposited sacrificial layers respectively are alternately deposited in a third direction perpendicular to a first direction and a second direction on a substrate having an upper surface extending in the first and second directions which are perpendicular to each other. Methods include forming a recess group including $2^n-1$ first recesses penetrating $2^0$ through $2^{n-1}$ deposited sacrificial layers and forming a buried insulating layer group including $2^n-1$ buried insulating layers filling the $2^n-1$ first recesses respectively. A contact plug group including $2^n$ contact plugs penetrating an uppermost deposited insulating layer of the $2^n$ deposited insulating layers and the $2^n-1$ buried insulating layers may be formed.

7 Claims, 35 Drawing Sheets

(52) U.S. Cl.
CPC ...... *H01L21/76877* (2013.01); *H01L 27/1157* (2013.01); *H01L 27/11519* (2013.01); *H01L 27/11524* (2013.01); *H01L 27/11548* (2013.01); *H01L 27/11556* (2013.01); *H01L 27/11565* (2013.01); *H01L 27/11575* (2013.01); *H01L 27/11582* (2013.01); *H01L 29/7889* (2013.01); *H01L 29/7926* (2013.01)

(56) References Cited

U.S. PATENT DOCUMENTS

| | | | |
|---|---|---|---|
| 8,278,699 | B2 | 10/2012 | Tanaka et al. |
| 8,395,206 | B2 | 3/2013 | Lee et al. |
| 8,405,141 | B2 | 3/2013 | Matsuda et al. |
| 8,492,824 | B2 | 7/2013 | Yahashi |
| 8,906,805 | B2 * | 12/2014 | Park et al. ............. 438/675 |
| 2002/0036330 | A1 | 3/2002 | Kobayashi |
| 2006/0108627 | A1 | 5/2006 | Choi et al. |
| 2008/0186771 | A1 | 8/2008 | Katsumata et al. |
| 2010/0207195 | A1 | 8/2010 | Fukuzumi et al. |
| 2010/0213526 | A1 | 8/2010 | Wada et al. |
| 2011/0019480 | A1 * | 1/2011 | Kito et al. ............. 365/185.18 |
| 2011/0201167 | A1 * | 8/2011 | Satonaka et al. ............. 438/268 |
| 2012/0193705 | A1 | 8/2012 | Lim et al. |
| 2012/0199897 | A1 | 8/2012 | Chang et al. |
| 2012/0238093 | A1 | 9/2012 | Park et al. |
| 2014/0051754 | A1 | 2/2014 | Durlach |

* cited by examiner

METHODS OF FABRICATING SEMICONDUCTOR DEVICES

CROSS-REFERENCE TO RELATED APPLICATIONS

This application is a divisional of U.S. patent application Ser. No. 13/418,585, filed Mar. 13, 2012 and claims the benefit of Korean Patent Application No. 10-2011-0022884, filed on Mar. 15, 2011, in the Korean Intellectual Property Office, the disclosures of which are incorporated herein in their entireties by reference.

BACKGROUND

The inventive concept relates to methods of fabricating semiconductor devices, and more particularly, to methods of fabricating semiconductor devices having a vertical channel structure.

Electronic products that have smaller sizes and are able to process more data are may be increasingly advantageous. Accordingly, the integration density of semiconductor memory devices used in such electronic products may be increased. As an attempt to increase the integration density of the semiconductor memory devices, nonvolatile memory devices having a vertical transistor structure, instead of an existing flat transistor structure, have been suggested.

SUMMARY

The inventive concept provides methods of fabricating semiconductor devices having a vertical channel structure.

According to some embodiments of the inventive concept, there are provided methods of fabricating semiconductor devices. Such methods may include forming a stacked structure of alternatingly deposited sacrificial layers and insulating layers on an upper surface of a substrate, the upper surface extending in a first direction and a second direction that is substantially perpendicular to the first direction, the stacked structure extending in a third direction that is substantially perpendicular to the first direction and the second direction. A recess group that includes a plurality of first recesses that penetrate the sacrificial layers except the first deposited sacrificial layer is formed, a buried insulating layer group that includes buried insulating layers that are configured to substantially fill the plurality of first recesses is formed, and a contact plug group that includes contact plugs that are configured to penetrate an uppermost one of the insulating layers and the buried insulating layers is formed. Some embodiments provide that forming the stacked structure includes forming $2^n$ deposited sacrificial layers and $2^n$ deposited insulating layers, that n is an integer that is greater than or equal to two, and that forming the recess group is performed by n quantity etch processes, each of the etch processes removing a portion of the stacked structure.

In some embodiments, the plurality of first recesses are disposed in the first direction. Some embodiments provide that ones of the plurality of first recesses are formed in a hole shape. In some embodiments, ones of the plurality of first recesses are formed in a line shape that extends in the second direction. Some embodiments provide that at least two adjacent ones of the first recesses are united.

In some embodiments, an m-th etch process of the n etch processes is performed so that, in the stacked structure, a cross sectional area of a portion removed by the m-th etch process is larger than that removed by an m-1-th etch process of the n etch processes, and m is an integer in a range from 2 to n.

Some embodiments provide that the substrate includes $2^n$ contact formation regions, that ones of the contact plugs are formed in different ones of the contact formation regions, and that forming the first recess group includes forming ones of the first recesses in $2^{n-1}$ ones of the contact formation regions of the stacked structure. In some embodiments, the n etch processes are performed to penetrate $2^k$ deposited sacrificial layers, respectively, and k is an integer in a range from 0 through n-1. Some embodiments provide that an etch process performed to penetrate the $2^k$ deposited sacrificial layers from among the n etch processes is simultaneously performed in all of $2^k$ successively adjacent contact formation regions.

In some embodiments, after forming the buried insulating layer group, the $2^n$ deposited sacrificial layers are removed and first conductive material is filled in a portion of spaces in which the $2^n$ deposited sacrificial layers are removed. Some embodiments provide that removing the $2^n$ deposited sacrificial layers includes dividing the stacked structure into a plurality of divided stacked structures extending in the first direction, removing portions of the $2^n$ deposited sacrificial layers included in the plurality of divided stacked structures, and filling the first conductive material in the spaces in which the $2^n$ deposited sacrificial layers are removed. Some embodiments provide that forming the contact plug group comprises forming a plurality of contact plug groups corresponding to the plurality of divided stacked structures, respectively.

In some embodiments, after forming the buried insulating layer group, a sacrificial plug group including $2^n$ sacrificial plugs contacting the deposited sacrificial layers is formed, respectively, by penetrating an uppermost deposited insulating layer of the deposited insulating layers and the buried insulating layers, respectively, and the sacrificial plug group and the deposited sacrificial layers are removed. Some embodiments provide that forming the contact plug group comprises filling conductive material in a portion of spaces in which the deposited sacrificial layers are removed and in a space in which the sacrificial plug group is removed.

In some embodiments, the stacked structure is formed on a memory cell region in which non-volatile memory cells are formed, a contact plug region in which the contact plugs are formed, and a stack dividing region, and the n etch processes remove portions of the stack dividing region so as to penetrate $2^0$ through $2^{n-1}$ deposited sacrificial layers, respectively, centering around a same location of the stack dividing region. Some embodiments provide that, after forming the recess group, a second recess is formed so as to penetrate an lowest deposited sacrificial layer, centering around the same location of the stack dividing region.

Some embodiments of the present inventive concept include methods of fabricating a semiconductor device. Such methods may include forming a stacked structure in which $2^n$ first material layers and $2^n$ second material layers on a substrate, each of the first material layers and each of the second material layers being alternately deposited on each other, and forming $2^n-1$ recesses penetrating a quantity of from $2^0$ to $2^n-1$ of the first material layers, respectively, so as that the $2^n-1$ recesses expose the quantity of $2^n-1$ of the first material layers from the substrate at bottoms of the recesses, respectively. In some embodiments, the $2^n-1$ recesses are formed by a combination of etch processes for penetrating $2^k$ first material layers, n is an integer that is greater than or equal to two, and k is an integer in a range from 0 to n-1. Some embodiments provide that etch processes performed to penetrate the same number of the first material layers from among etch processes for forming the $2^n-1$ recesses are simultaneously performed. In some embodiments, portions of the stacked structure in which $2^{n-1}$ recesses of the $2^n-1$ recesses are to be formed are respectively removed in etch processes for forming the $2^n-1$ recesses.

Some embodiments of the present invention are directed to methods of fabricating semiconductor devices. Such methods may include forming a stacked structure in which $2^n$ (here, n is an integer which is 2 or more) deposited sacrificial layers and $2^n$ deposited insulating layers disposed on the $2^n$ deposited sacrificial layers respectively are alternately deposited in a third direction that is perpendicular to a first direction and a second direction on a substrate having an upper surface extending in the first and second directions which are perpendicular to each other, forming a recess group including $2^n-1$ first recesses penetrating $2^n$ through $2^{n-1}$ deposited sacrificial layers, respectively, from an uppermost deposited sacrificial layer of the $2^n$ deposited sacrificial layers, forming a buried insulating layer group including $2^n-1$ buried insulating layers filling the $2^n-1$ first recesses respectively and forming a contact plug group including $2^n$ contact plugs penetrating an uppermost deposited insulating layer of the $2^n$ deposited insulating layers and the $2^n-1$ buried insulating layers, respectively. Some embodiments provide that forming the recess group is performed by n etch processes each for removing a portion of the stacked structure.

Some embodiments include, after forming the buried insulating layer group, removing the $2^n$ deposited sacrificial layers and filling first conductive material in a portion of spaces in which the $2^n$ deposited sacrificial layers are removed. In some embodiments, removing the $2^n$ deposited sacrificial layers comprises dividing the stacked structure into a plurality of divided stacked structures extending in the first direction, removing portions of the $2^n$ deposited sacrificial layers included in the plurality of divided stacked structures, and filling the first conductive material in the spaces in which the $2^n$ deposited sacrificial layers are removed. Some embodiments provide that forming the contact plug group comprises forming a plurality of contact plug groups corresponding to the plurality of divided stacked structures, respectively.

Some embodiments include, after forming the buried insulating layer group, forming a sacrificial plug group including $2^n$ sacrificial plugs contacting the $2^n$ deposited sacrificial layers, respectively, by penetrating the uppermost deposited insulating layer of the $2^n$ deposited insulating layers and the $2^n-1$ buried insulating layers, respectively, and removing the sacrificial plug group and the $2^n$ deposited sacrificial layers. Some embodiments provide that forming the contact plug group comprises filling conductive material in a portion of spaces in which the $2^n$ deposited sacrificial layers are removed and in a space in which the sacrificial plug group is removed.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
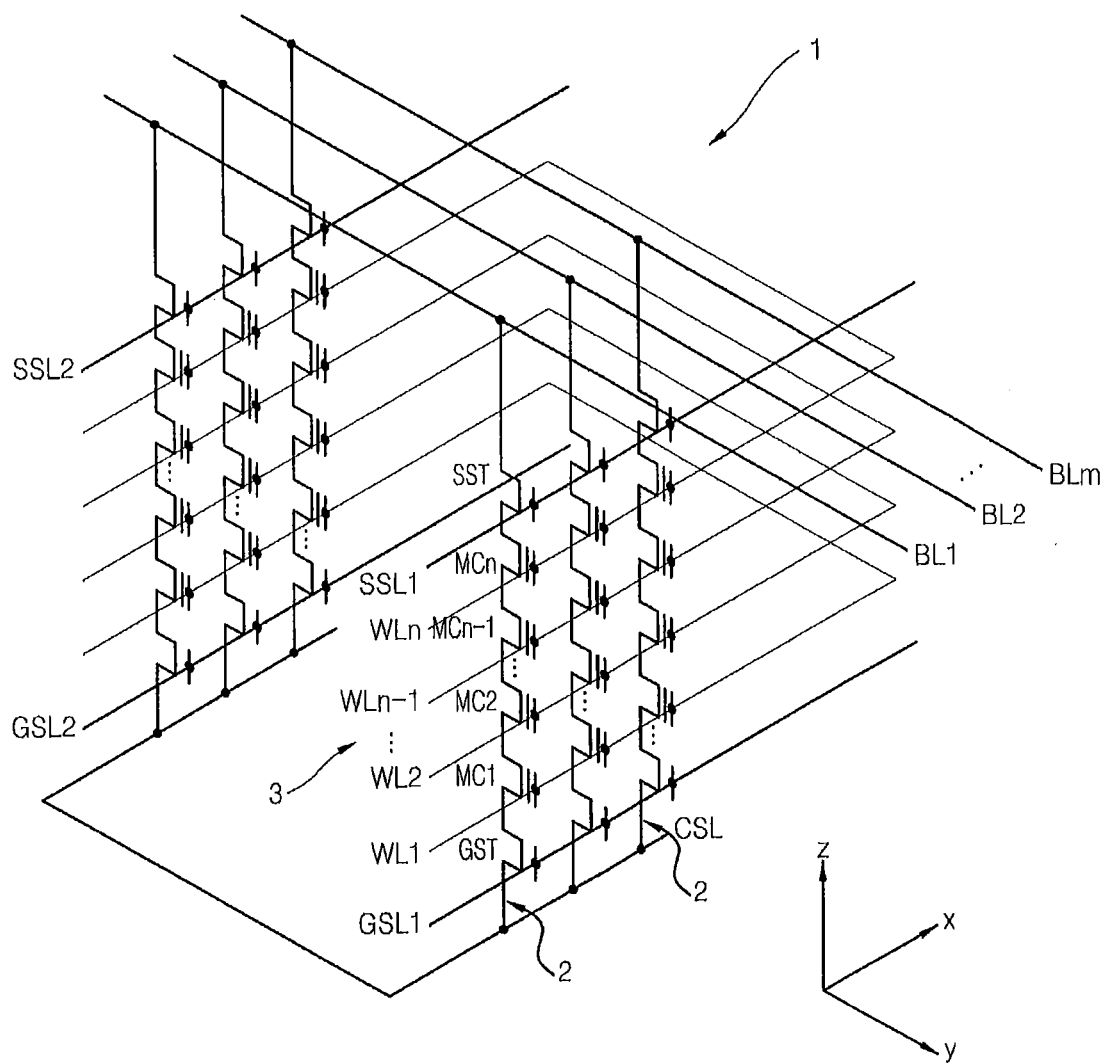
FIG. 1 is a circuit diagram illustrating an arrangement structure of a nonvolatile memory cell array of a semiconductor device having a vertical structure according to some embodiments of the inventive concept.

The present invention now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which some embodiments of the inventive concept are shown. This inventive concept, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventive concepts is provided.

Reference numerals are indicated in detail in some embodiments of the present inventive concept, and their examples are represented in reference drawings. Throughout the drawings, like reference numerals are used for referring to the same or similar elements in the description and drawings.

FIG. 1 is a circuit diagram illustrating an arrangement structure of a nonvolatile memory cell array 1 of a semiconductor device having a vertical structure according to some embodiments of the inventive concept.

Referring to FIG. 1, the nonvolatile memory cell array 1 may include a plurality of NAND cell strings 2. The plurality of NAND cell strings 2 may be arranged in a matrix form having rows and columns. A memory cell block 3 may include a plurality of NAND cell strings arranged in a row (in an X-axis direction) and/or a column (in a Z-axis direction).

Each of the plurality of NAND cell strings 2 may include a plurality of memory cells MC1 through MCn, a string selection transistor SST, and a ground selection transistor GST. In each of the NAND cell strings 11, the ground selection transistor GST, the plurality of memory cells MC1 through MCn, and the string selection transistor SST may be arranged in series in the vertical direction (that is, the Z-axis direction).

A plurality of bit lines BL1 through BLm may be connected to one side of each of the NAND cell strings 2 arranged in the memory cell block 3, for example, to a drain of the string selection transistor SST. Also, a common source line CSL may be connected to other side of each of the NAND cell strings 2, for example, to a source of the ground selection transistor GST.

The plurality of memory cells MC1 through MCn may be arranged in series in the vertical direction between the string selection transistor SST and the ground selection transistor GST. The word lines WL1 through WLn may be commonly connected to gates of memory cells arranged in the same layer from among the plurality of memory cells MC1 through MCn. Data may be programmed, read, or erased in the plurality of memory cells MC1 through MCn as the word lines WL1 through WLn are driven.

The string selection transistor SST may be disposed between the bit lines BL1 through BLm and the memory cells MC1 through MCn. In the memory cell block 3, each string selection transistor SST may control data to be transmitted between the plurality of the bit lines BL1 through BLm and the plurality of the memory cells MC1 through MCn due to a string selection line SSL connected to a gate of the string selection transistor SST.

The ground selection transistor GST may be disposed between the plurality of memory cells MC1 through MCn and the common source line CSL. In the memory cell block 3, each ground selection transistor GST may control data to be transmitted between the plurality of memory cells MC1 through MCn and the common source line CSL due to a ground selection line GSL connected to a gate of the ground selection transistor GST.

A detailed structure of the memory cell array 1 shown in FIG. 1 and a method of fabricating the memory cell array 1 is explained below. For convenience of explanation, the memory cells MC1 through MCn, the string selection transistor SST, and the ground selection transistor GST which constitute the NAND cell strings 2, and the word lines WL1-WLn, string selection lines SSL1 and SSL2, and ground selection lines GSL1 and GSL2 are mainly explained, and explanations of the other elements may be simplified or omitted. However, omitted elements may be added by one of ordinary skill in the art without departing from the technical teaching and scope of the inventive concept.

FIGS. 2 through 33 are cross-sectional and plan views illustrating methods of fabricating semiconductor devices and a structure of the semiconductor devices, according to some embodiments of the inventive concept.

FIGS. 2 through 7 illustrate methods of forming a buried insulating layer group for fabricating semiconductor devices according to some embodiments of the inventive concept.

Figure 2:
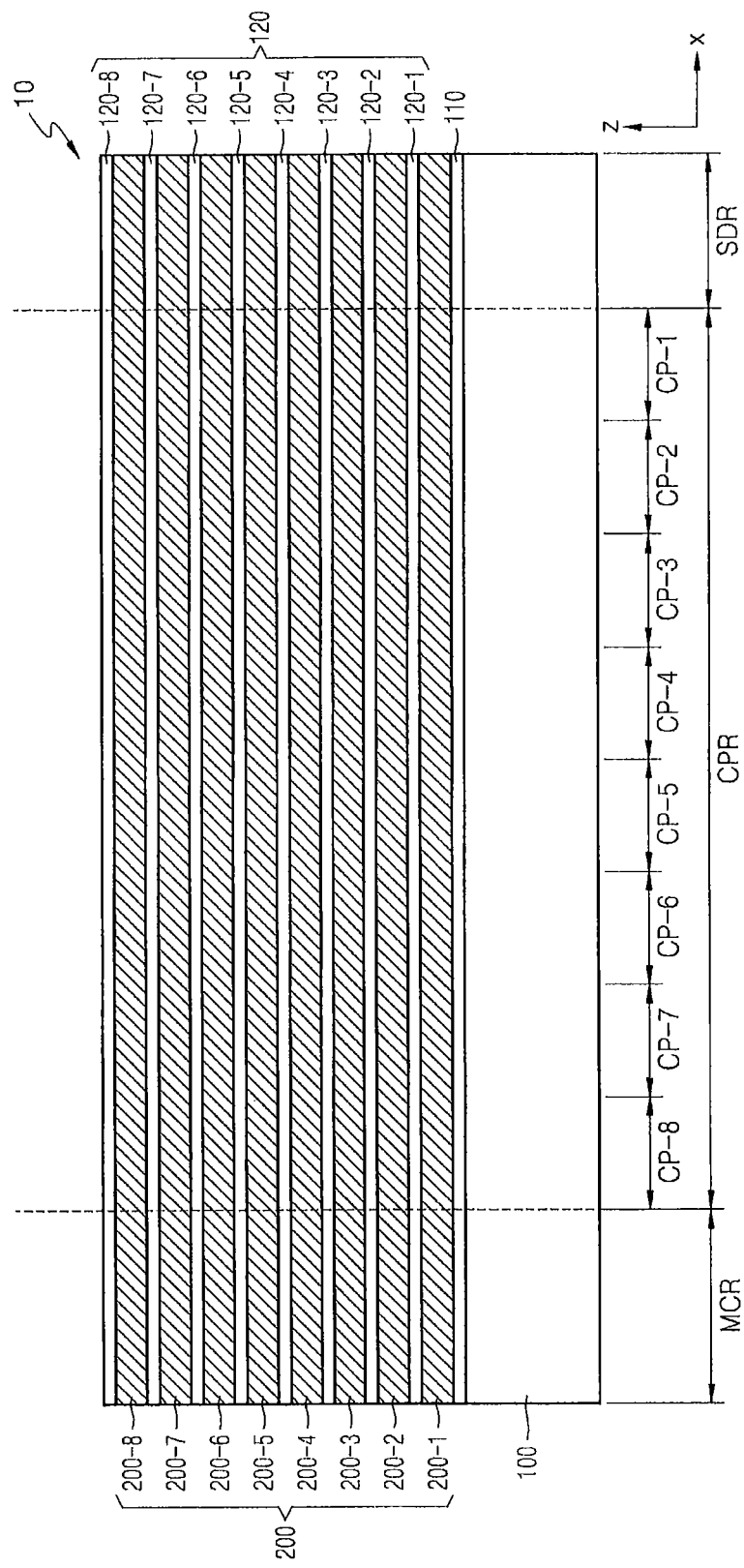
FIG. 2 is a cross-sectional view illustrating a process of forming a stacked structure for fabricating a semiconductor device according to some embodiments of the inventive concept.

Referring to FIG. 2, a plurality of deposited sacrificial layers 200-1 through 200-8 and a plurality of deposited insulating layers 120-1 through 120-8 are alternately stacked on a substrate 100. A structure in which the plurality of deposited sacrificial layers 200-1 through 200-8 and the plurality of deposited insulating layers 120-1 through 120-8 are alternately stacked may be referred to as a stacked structure 10. A base insulating layer 110 may be further formed on the substrate 100, and may be disposed between the substrate 100 and the stacked structure 10. The plurality of deposited sacrificial layers 200-1 through 200-8 may be referred to as a first material layer, and the plurality of deposited insulating layers 120-1 through 120-8 may be referred to as a second material layer.

The case where eight, namely, $2^3$, deposited sacrificial layers 200-1 through 200-8 and $2^3$ deposited insulating layers 120-1 through 120-8 are alternately stacked on the substrate 100 is illustrated in FIG. 2, but the inventive concept is not limited thereto. For example, $2^n$ (here, n is an integer that is equal to or greater than 2) deposited sacrificial layers 200 and $2^n$ deposited insulating layers 120 may be alternately stacked on the substrate 100. In addition, deposited sacrificial layers of which number is greater than $2^n$ and smaller than $2^{n+1}$ and deposited insulating layers of which number is greater than $2^n$ and smaller than $2^{n+1}$ may be alternately stacked on the substrate 100.

The substrate 100 may have an upper surface extending in a first direction (the X-axis direction) and a second direction (a Y-axis direction) that is perpendicular to the first direction. Although not visible in the view of FIG. 2, the second direction is illustrated in the plan view provided in FIG. 12. The substrate 100 may include a semiconductor material, for example, a IV group semiconductor, a III-V group compound semiconductor, and/or a II-VI group oxide semiconductor, among others. For example, the IV group semiconductor may include Si, Ge, or Si—Ge. The substrate 100 may be a bulk wafer and/or a wafer having an epitaxial layer.

A memory cell region MCR, a contact plug region CPR, and a stack dividing region SDR may be defined in the substrate 100. Memory cells such as nonvolatile memory cells may be formed in the memory cell region MCR. For example, NAND type memory cells may be formed in the memory cell region MCR.

In the contact plug region CPR, contact plugs which are electrically connected to the word lines WL1-WLn and the selection lines SSL1, SSL2, GSL1, and GSL2 may be formed. A plurality of contact formation regions CP-1 through CP-8 may be defined in the contact plug region CPR. In the contact formation regions CP-1 through CP-8, contact plugs may be formed to be electrically connected to word lines or selection lines at different levels from each other on the substrate 100. In the case where the number of the deposited sacrificial layers 200-1 through 200-8 included in the stacked structure 10 is $2^n$, the number of the contact formation regions CP-1 through CP-8 defined in the contact plug region CPR may be $2^n$ or greater than $2^n$.

The deposited sacrificial layers 200-1 through 200-8 and the deposited insulating layers 120-1 through 120-8 may be alternately stacked in a third direction (the Z-axis direction) perpendicular to the first direction (the X-axis direction) and the second direction (the Y-axis direction) on the substrate, and thus, the stacked structure 10 may be formed. An N-th deposited insulating layer 120-N (here, N is an integer of 1 through $2^n$) may be disposed on an N-th deposited sacrificial layer 200-N. The deposited sacrificial layers 200 and the deposited insulating layers 120 may be formed of different materials having different etch selectivities from each other. For example, if the deposited sacrificial layers 200 are formed of a nitride, the deposited insulating layers 120 may be formed of an oxide.

The base insulating layer 110 may be formed on the substrate 100 so as to be disposed between the substrate 100 and the stacked structure 10. Accordingly, N deposited sacrificial layers 200-1 through 200-N may be disposed between N+1 insulating layers, namely, the base insulating layer 110 and N deposited insulating layers 120-1 through 120-N. The base insulating layer 110 may be formed of a different material having a different etch selectivity from those of the deposited sacrificial layers 200. For example, if the deposited sacrificial layers 200 are formed of a nitride, the base insulating layer 110 may be formed of an oxide. The base insulating layer 110 and the deposited insulating layers 120 may be formed of the same material or materials having similar characteristics.

In the stack dividing region SDR, the stacked structure 10 may be penetrated and cut so that memory cell blocks are separated from each other. In addition, in the stack dividing region SDR, a well contact plug penetrating the stacked structure 10 may be formed to electrically connect with a well formed in the substrate 100, for example, a pocket P-type well and to apply a voltage to the well.

Figure 3:
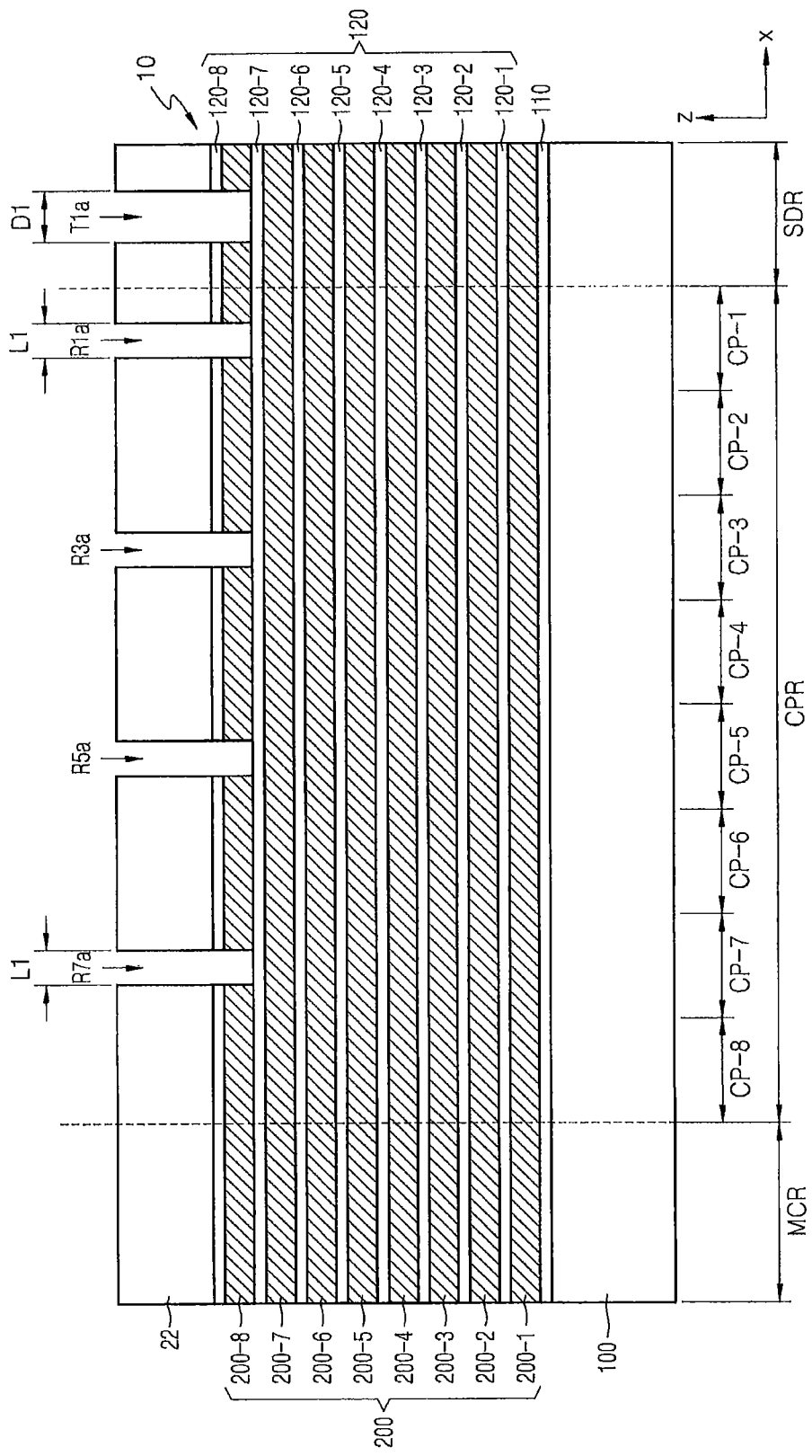
FIGS. 3 through 5 are cross-sectional views illustrating processes of performing first through third etch processes for fabricating the semiconductor device according to some embodiments of the inventive concept.

Referring to FIG. 3, a first photoresist pattern 22 is formed on the stacked structure 10. The first photoresist pattern 22 may be formed so as to have openings in the $2^{n-1}$ contact formation regions CP-1, CP-3, CP-5, and CP-7 from among the $2^n$ contact formation regions CP-1 through CP-8 defined in the contact plug region CPR. The first photoresist pattern 22 may be formed so as to selectively have an opening also in the stack dividing region SDR.

By using the first photoresist pattern 22 as an etch mask, a first etch process may be performed and a portion of the stacked structure 10 may be removed. Through the first etch process, a portion of the stacked structure 10 may be removed so as to penetrate the uppermost deposited sacrificial layer 200-8 of the deposited sacrificial layers 200 included in the stacked structure 10, namely, the $2^n$-th deposited sacrificial layer 200-8 from the substrate 100 from among the $2^n$ deposited sacrificial layers 200. That is, through the first etch process using the first photoresist pattern 22 as the etch mask, first preliminary recesses R1a, R3a, R5a, and R7a penetrating the uppermost deposited sacrificial layer 200-8 may be formed in the contact formation regions CP-1, CP-3, CP-5, and CP-7 corresponding to half of the contact formation regions CP-1 through CP-8 defined in the contact plug region CPR.

For example, through the first etch process, a portion of the stacked structure 10 may be removed so that the seventh deposited insulating layer 120-7 is exposed by penetrating the eighth deposited insulating layer 120-8 and the eighth deposited sacrificial layer, namely, the uppermost deposited sacrificial layer 200-8. In addition, although not illustrated, a portion of the stacked structure 10 may be removed so that the seventh deposited sacrificial layer 200-7 is exposed by penetrating also the seventh deposited insulating layer 120-7.

As described below, in an n-th etch process, etching may be performed so that the $2^{n-1}$ deposited sacrificial layers 200 are penetrated. In addition, in the n-th etch process, etching may be performed to remove a portion of the stacked structure 10 with respect to the $2^{n-1}$ successive contact formation regions CP-1 through CP-8. Accordingly, in the first etch process, $2^{(1-1)}=2^0=1$, namely, one deposited sacrificial layer 200-8, is penetrated. The first etching process may be simultaneously performed in alternate contact formation regions CP-1, CP-3, CP-5, and CP-7, namely, in $2^{(1-1)}=2^0=1$ successive contact formation regions CP-1, CP-3, CP-5, and CP-7, separated from each other.

As used herein, the description that an etch process is performed in any "region" means that the entire "region" or a part of the "region" is exposed via a photoresist pattern and then etching, namely, a removal of a structure, is performed only in the "region".

In addition, penetrating the N deposited sacrificial layers 200 during an etch process means that a portion of the stacked structure 10 is removed so that the N deposited sacrificial layers 200 are "additionally" penetrated through the etch process.

In addition, in the case where an opening is formed in a portion of the stack dividing region SDR by the first photoresist pattern 22, a first preliminary selection recess T1a penetrating the eighth deposited sacrificial layer 200-8 may be formed also in the stack dividing region SDR.

The portion of the stacked structure 10 removed through the first etch process may have a first width L1 or D1. The first width L1 in the contact plug region CPR and the first width D1 in the stack dividing region SDR may be equal to or different from each other. In addition, in FIG. 3 and the following cross-sectional views, a removed portion of the stacked structure 10 is illustrated based on a width of the removed portion. However, since widths of removed portions of the stacked structure 10 may be different from each other, cross-sectional areas of removed portions of the stacked structure 10 may also be different from each other, which may be confirmed in the plan views illustrated in FIGS. 12, 13, 19, and 26 through 28.

Figure 4:
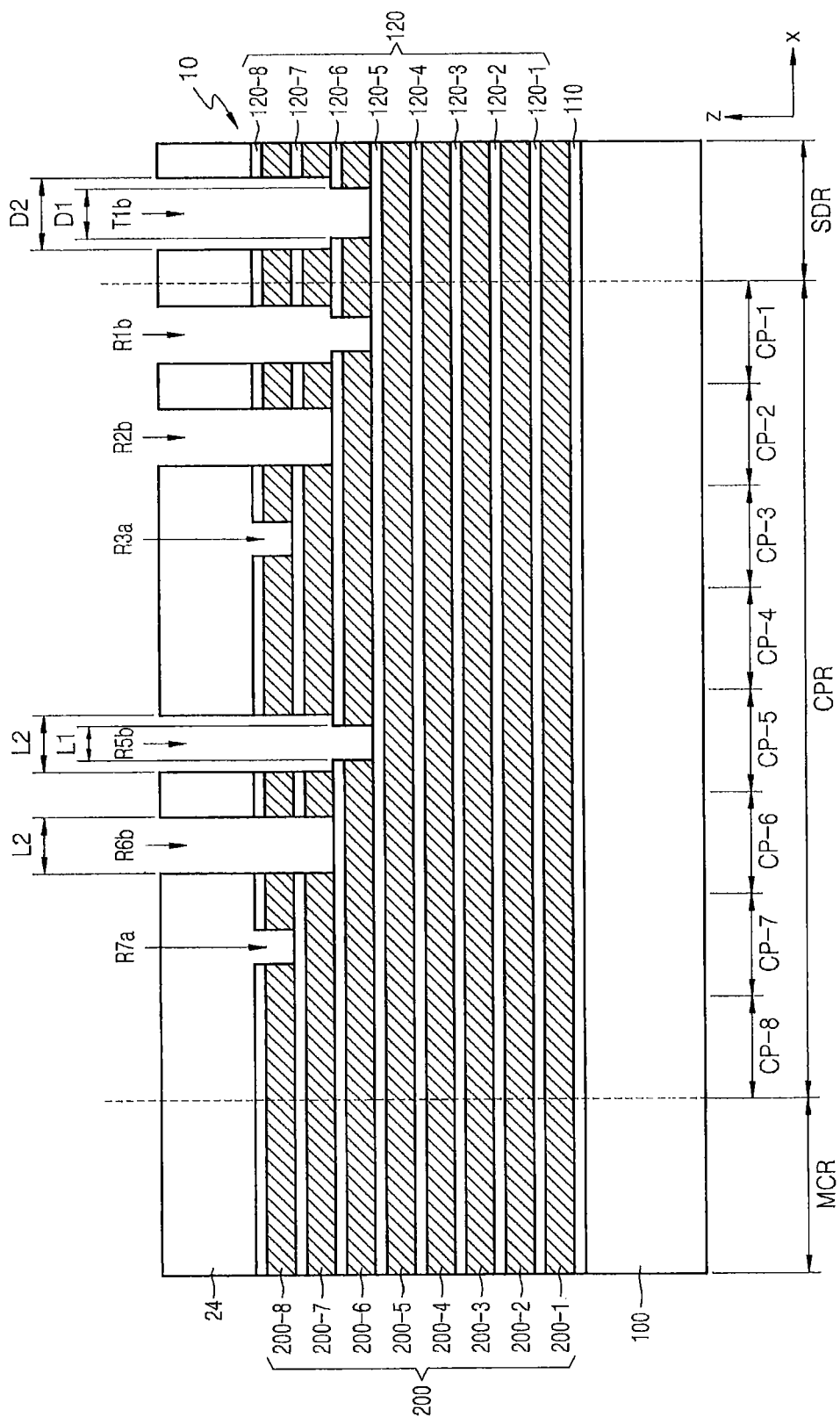

Referring to FIG. 4, a second photoresist pattern 24 is formed on the stacked structure 10. The second photoresist pattern 24 may be formed so as to have openings in the $2^{n-1}$ contact formation regions CP-1, CP-2, CP-5, and CP-6 of the contact formation regions CP-1 through CP-8 defined in the contact plug region CPR. The second photoresist pattern 24 may be formed so as to selectively have an opening also in the stack dividing region SDR.

By using the second photoresist pattern 24 as an etch mask, a second etch process may be performed and a portion of the stacked structure 10 may be removed. Through the second etch process, a portion of the stacked structure 10 may be removed so as to penetrate two deposited sacrificial layers 200-8 and 200-7 or two deposited sacrificial layers 200-7 and 200-6 of the deposited sacrificial layers 200 included in the stacked structure 10. That is, a portion of the stacked structure 10 may be removed by using the second etch process so as to further penetrate the two deposited sacrificial layers 200-8 and 200-7 or the two deposited sacrificial layers 200-7 and 200-6 of the deposited sacrificial layers 200 through openings of the second photoresist pattern 24.

For example, through the second etch process using the second photo resist pattern 24 as an etch mask, a portion of the stacked structure 10 may be removed so that the sixth deposited insulating layer 120-6 is exposed by penetrating the eighth deposited insulating layer 120-8, the eighth deposited sacrificial layer 200-8, the seventh deposited insulating layer 120-7, and the seventh deposited sacrificial layer 200-7. In addition, through the second etch process using the second photoresist pattern 24 as an etch mask, a portion of the stacked structure 10 may be removed so that the fifth deposited insulating layer 120-5 is exposed by penetrating the seventh deposited insulating layer 120-7, the seventh deposited sacrificial layer 200-7, the sixth deposited insulating layer 120-6, and the sixth deposited sacrificial layer 200-6, and, in this case, the eighth deposited insulating layer 120-8 and a portion of the eighth deposited sacrificial layer 200-8 may be additionally removed.

Through the second etch process using the second photoresist pattern 24 as the etch mask, second preliminary recesses R1$b$, R2$b$, R5$b$, and R6$b$ penetrating the two deposited sacrificial layers 200-8 and 200-7 or the two deposited sacrificial layers 200-7 and 200-6 may be formed in the contact formation regions CP-1, CP-2, CP-5, and CP-6 corresponding to half of the contact formation regions CP-1 through CP-8 defined in the contact plug region CPR.

Because two first preliminary recesses R3$a$ and R7$a$ of the first preliminary recesses R1$a$, R3$a$, R5$a$, and R7$a$ illustrated in FIG. 3 are covered by the second photoresist pattern 24, the two first preliminary recesses R3$a$ and R7$a$ remain as they are. However, the remaining two first preliminary recesses R1$a$ and R5$a$ are included inside the second preliminary recesses R1$b$ and R5$b$ by the second etch process. Two second preliminary recesses R1$b$ and R5$b$ formed in locations in which two first preliminary recesses R1$a$ and R5$a$ exposed by the second photoresist pattern 24 are formed may be formed more deep than the other preliminary recesses R2$b$ and R6$b$ due to the influence of the first preliminary recesses R1$a$ and R5$a$.

Accordingly, in the second etch process, $2^{(2-1)}=2^1=2$, namely, the two deposited sacrificial layers 200-8 and 200-7, and 200-7 and 200-6, are additionally penetrated. The second etch process may be simultaneously performed in $2^{(2-1)}=2^1=2$ successively adjacent contact formation regions CP-1 and CP-2, and CP-5 and CP-6, wherein 2 successively adjacent contact formation regions CP-1 and CP-2, and another 2 successively adjacent contact formation regions CP-5 and CP-6 are separated from each other. That is, an etching is performed in the two successively adjacent contact formation regions CP-1 and CP-2, and CP-5 and CP-6 of the eight contact formation region CP-1 through CP-8, and is not performed in the remaining two successively adjacent contact formation regions CP-3 and CP-4, and CP-7 and CP-8 due to a covering of the second photoresist pattern 24.

In addition, in the case where an opening is formed also in the stack dividing region SDR by the second photoresist pattern 24, a second preliminary selection recess T1$b$ additionally penetrating the seventh deposited sacrificial layer 200-7 and the sixth deposited sacrificial layer 200-6 may be formed also in the stack dividing region SDR. An opening of the first photoresist pattern 22 and an opening of the second photoresist pattern 24, which are formed in the stack dividing region SDR, may be formed centering around a same location.

The portion of the stacked structure 10 removed through the second etch process, namely, portions in which the second preliminary recesses R1$b$, R2$b$, R5$b$, and R6$b$ and the second preliminary selection recess T1$b$ are formed, may have a second width L2 or D2. In this case, the two preliminary recesses R2$b$ and R6$b$ may be formed so as to have the second width L2 in all portions. On the other hand, the remaining two preliminary recesses R1$b$ and R5$b$ may be formed so as to have the second width L2 in a portion penetrating the eighth and seventh deposited sacrificial layers 200-8 and 200-7, but may be formed so as to have the first width L1 in a portion penetrating the sixth deposited sacrificial layer 200-6. In addition, the second preliminary selection recess T1$b$ may be formed so as to have the second width D2 in a portion penetrating the eighth and seventh deposited sacrificial layers 200-8 and 200-7, but may be formed so as to have the first width D1 in a portion penetrating the sixth deposited sacrificial layer 200-6.

The second width L2 in the contact plug region CPR and the second width D2 in the stack dividing region SDR may be equal to or different from each other. In the contact plug region CPR, the second width L2 may be wider than the first width L1. In the stack dividing region SDR, the second width D2 may be wider than the first width D1.

An opening of the first photoresist pattern 22 and an opening of the second photoresist pattern 24, which are formed in the stack dividing region SDR, may be formed centering around about the same location.

Figure 5:
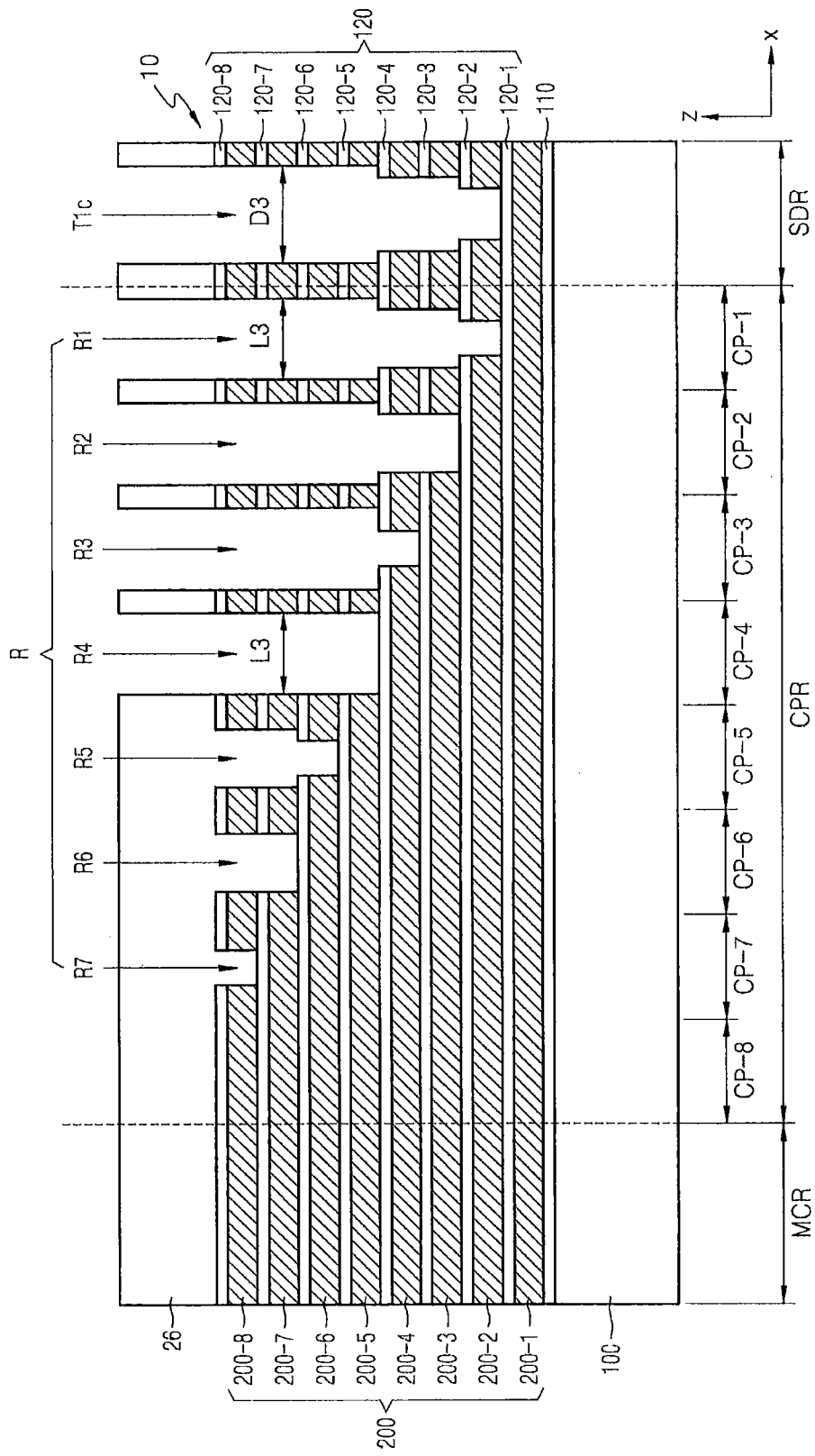

Referring to FIG. 5, a third photoresist pattern 26 is formed on the stacked structure 10. The third photoresist pattern 26 may be formed so as to have openings in the $2^{n-1}$ contact formation regions CP-1 through CP-4 of the $2^n$ contact formation regions CP-1 through CP-8 defined in the contact plug region CPR. The third photoresist pattern 26 may be formed so as to selectively have an opening also in the stack dividing region SDR.

By using the third photoresist pattern 26 as an etch mask, a third etch process may be performed and a portion of the stacked structure 10 may be removed. Through the third etch process, a portion of the stacked structure 10 may be removed so as to penetrate $2^{n-1}$ deposited sacrificial layers 200-8 through 200-5, 200-7 through 200-4, 200-6 through 200-3, and 200-5 through 200-2 of the $2^n$ deposited sacrificial layers 200 included in the stacked structure 10. That is, a portion of the stacked structure 10 may be removed by using the third etch process so as to further penetrate four deposited sacrificial layers 200-8 through 200-5, 200-7 through 200-4, 200-6 through 200-3, and 200-5 through 200-2 of the eight deposited sacrificial layers 200 through openings of the third photoresist pattern 24.

For example, through the third etch process using the third photo resist pattern 26 as an etch mask, a portion of the stacked structure 10 may be removed so that the fourth deposited insulating layer 120-4 is exposed by penetrating the eighth deposited insulating layer 120-8, the eighth deposited sacrificial layer 200-8, the seventh deposited insulating layer 120-7, the seventh deposited sacrificial layer 200-7, the sixth deposited insulating layer 120-6, the sixth deposited sacrificial layer 200-6, the fifth deposited insulating layer 120-5, and the fifth deposited sacrificial layer 200-5.

Through the third etch process using the third photoresist pattern 26 as the etch mask, first recesses R1, R2, R3, and R4 penetrating four deposited sacrificial layers 200-8 through 200-5, 200-7 through 200-4, 200-6 through 200-3, and 200-5 through 200-2 may be formed in the contact formation regions CP-1 through CP-4 corresponding to half of the contact formation regions CP-1 through CP-8 defined in the contact plug region CPR. Because one first preliminary recess R7a and two second preliminary recesses R5b and R6b from among the first preliminary recesses R3a and R7a and the second preliminary recesses R1b, R2b, R5b, and R6b illustrated in FIG. 4 are covered by the third photoresist pattern 26, the one first preliminary recesses R7a and the two second preliminary recesses R5b and R6b remain as they are. The two second preliminary recesses R5b and R6b and the one first preliminary recess R7a may be also called first recesses R5, R6, and R7. However, the remaining one first preliminary recess R3a and the remaining two second preliminary recesses R1b and R2b are included inside the first recesses R1, R2, and R3 by the third etch process. Three first recesses R1, R2, and R3 formed in locations in which the one first preliminary recess R3a and the remaining two preliminary recesses R1b and R2b exposed by the third photoresist pattern 26 are formed may be formed more deep than the other first recess R4 due to the influence of the first preliminary recess R3a and the second preliminary recesses R1b and R2b. The $2^n-1$ first recesses R1 through R7 formed in the contact plug region CPR may be disposed in the first direction (the X-axis direction).

Accordingly, in the third etch process, $2^{(3-1)}=2^2=4$, namely, the four deposited sacrificial layers 200-8 through 200-5, 200-7 through 200-4, 200-6 through 200-3, and 200-5 through 200-2, are additionally penetrated, and an etching for additionally penetrating the four deposited sacrificial layers 200-8 through 200-5, 200-7 through 200-4, 200-6 through 200-3, and 200-5 through 200-2 may be simultaneously performed in $2^{(3-1)}=2^2=4$ successively adjacent contact formation regions CP-1 through CP-4. An etching may be not performed in the remaining four successively adjacent contact formation regions CP-5 through CP-8 due to a covering of the third photoresist pattern 26.

In addition, in the case where an opening is formed also in the stack dividing region SDR by the third photoresist pattern 26, a third preliminary selection recess T1c additionally penetrating the fifth deposited sacrificial layer 200-5 through the second deposited sacrificial layer 200-2 may be formed also in the stack dividing region SDR. An opening of the third photoresist pattern 26 and an opening of the second photoresist pattern 24, which are formed in the stack dividing region SDR, may be formed centering around the same location.

The portion of the stacked structure 10 removed through the third etch process, namely, portions in which the four first recesses R1, R2, R3, and R4 and the third preliminary selection recess T1c are formed may have a third width L3 or D3. In this case, the previously etched recesses R1, R2, R3, and T1c from among the first recesses R1, R2, R3, and R4 and the third preliminary selection recess T1c may be formed so as to have the first width L1 or D1 and the second width L2 or D2 which is narrower than the first width L1 or D1, depending on depths of the recesses R1, R2, R3, and T1c. The first recesses R4 etched for the first time may be formed so as to have the third width L3 in all portions.

The third width L3 in the contact plug region CPR and the third width D3 in the stack dividing region SDR may be equal to or different from each other. In the contact plug region CPR, the third width L3 may be wider than the second width L2. In the stack dividing region SDR, the third width D3 may be wider than the second width D2.

An opening of the second photoresist pattern 24 and an opening of the third photoresist pattern 26, which are formed in the stack dividing region SDR, may be formed centering around about the same location.

Referring to FIGS. 3 through 5, if the $2^3$ deposited sacrificial layers 200-1 through 200-8 are included in the stacked structure 10, the $2^3-1$ first recesses R1 through R7 may be formed through three-time etch processes. That is, if $2^n$ deposited sacrificial layers 200 are included in the stacked structure 10, $2^n-1$ first recesses R1 through R7 may be formed through n-time etch processes. In this case, the number of the deposited sacrificial layers 200 penetrated by each of the first recesses R1 through R7 is 1 through 7, namely, $2^0$ through $2^3-1$, and the number of the deposited sacrificial layers 200 penetrated by each of the first recesses R1 through R7 may be determined by a combination within n-time of $2^k$ (here, k is an integer 0 through n−1). That is, the first recesses R1 through R7 may be formed so as to penetrate $2^0+2^1+2^2$, $2^1+2^2$, $2^0+2^2$, $2^2$, $2^0+2^1$, $2^1$, and $2^0$ of the $2^3$ deposited sacrificial layers 200 respectively. Here, the $2^n-1$ first recesses R1 through R7 each penetrating $2^0$ through $2^n-1$ deposited sacrificial layers 200 may be called generically as a recess group R.

Each of the $2^n-1$ first recesses R1 through R7 may be formed by one time etch process or 2 time through n-time etch processes. In addition, an m-th etch process of n-times etch processes may be performed so that, in the stacked structure 10, cross-sectional areas of portions removed by the m-th etch process are larger than those removed by an m−1-th etch process of the n-time etch processes (here, m is an integer 2 through n). Accordingly, depending on the number of the etch processes which are performed to form the recess group R, each of the first recesses R1 through R7 may have a portion in which a cross-sectional area is changed. That is, the first recess R1 formed through three-time etch processes may have 2 portions in which a cross-sectional area is changed. For example, in the first recess R1, a first cross-sectional area is changed after penetrating one deposited sacrificial layer 200-

2, a second cross-sectional area is changed after penetrating two deposited sacrificial layers 200-3 and 200-4, and then four deposited sacrificial layers 200-5 through 200-8 are penetrated.

The description that the cross-sectional area is changed does not mean that the cross-sectional area is continuously changed by a process condition, an etch profile, or the like, but means that the cross-sectional area is discontinuously changed like a stair shape.

Figure 6:
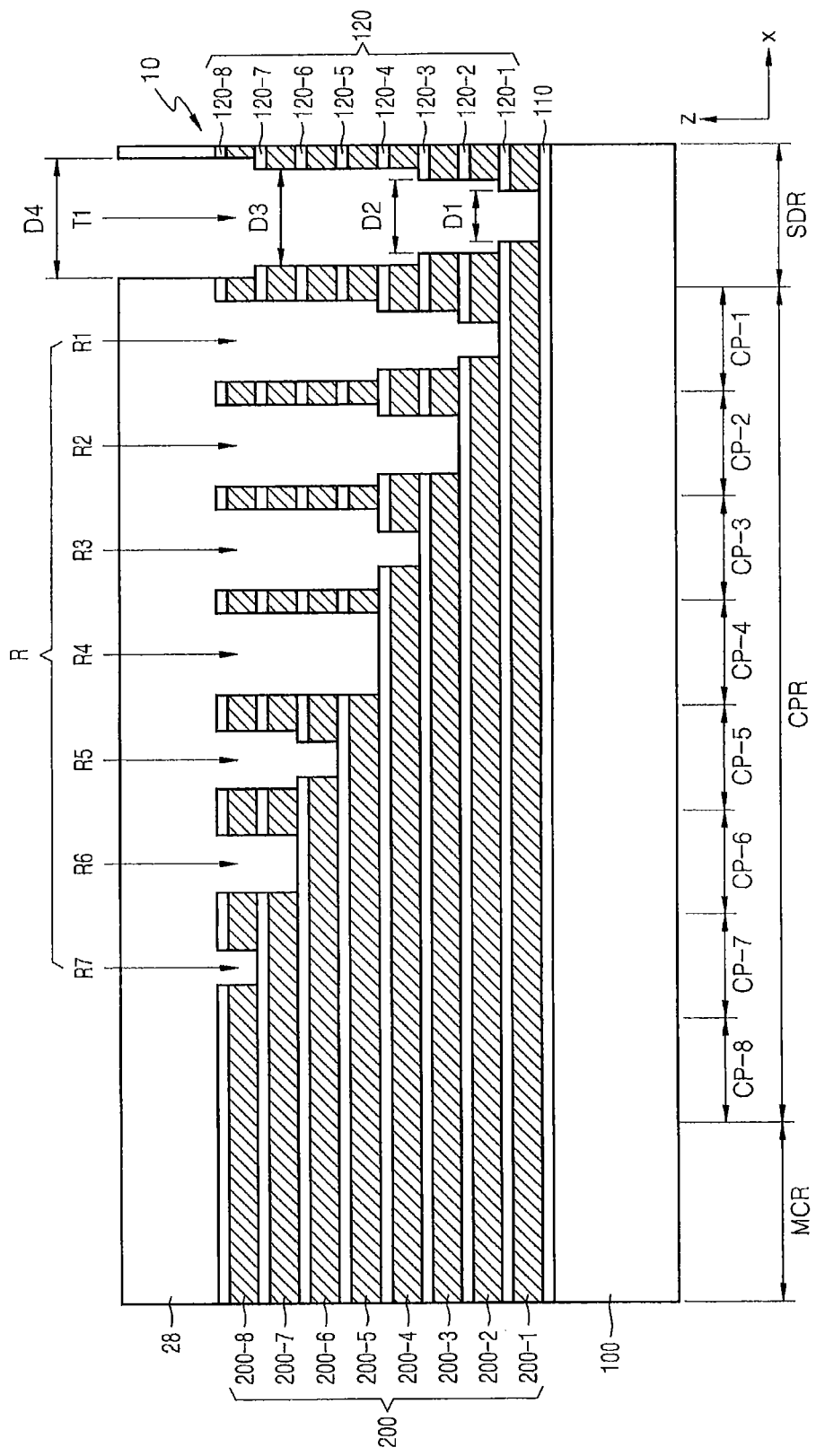
FIG. 6 is a cross-sectional view illustrating a process of performing a fourth etch process for fabricating a semiconductor device according to some embodiments of the inventive concept.

Referring to FIG. 6, a fourth photoresist pattern 28 may be formed on the stacked structure 10. The fourth photoresist pattern 28 may be formed so as to have an opening in the stack dividing region SDR. An opening of the fourth photoresist pattern 28 and an opening of the third photoresist pattern 26, which are formed in the stack dividing region SDR, may be formed centering around a same location. By using the fourth photoresist pattern 28 as an etch mask, a fourth etch process is performed, and thus a portion of the stacked structure 10 may be removed in the stack dividing region SDR. Through the fourth etch process, a portion of the stacked structure 10 may be removed so as to additionally penetrate one deposited sacrificial layer 200-1 in the stack dividing region SDR. Accordingly, in the stack dividing region SDR, a second recess T1 penetrating all of the deposited sacrificial layers 200 included in the stacked structure 10 may be formed.

A portion removed through the fourth etch process in the stacked structure 10, namely, a portion in which the second recess T1 is formed may be a portion having a fourth width D4. In this case, the second recess T1 may be formed so as to have the first through third widths D1-D3 which are narrower than the fourth width D4, depending on depth of the second recess T1.

In FIGS. 3 through 5, the case where the first through third etch processes are performed in both of the contact plug region CPR and the stack dividing region SDR is illustrated. However, the first through third etch processes may not be performed in the stack dividing region SDR in some embodiments. If the first through third etch processes are not performed in the stack dividing region SDR, the fourth etch process may not be performed and may be an etch process performed to penetrate all of the deposited sacrificial layers 200. If the fourth etch process is an etch process performed to penetrate all of the deposited sacrificial layers 200, a portion in which a cross sectional area is changed may not be formed in the second recess T1.

Figure 7:
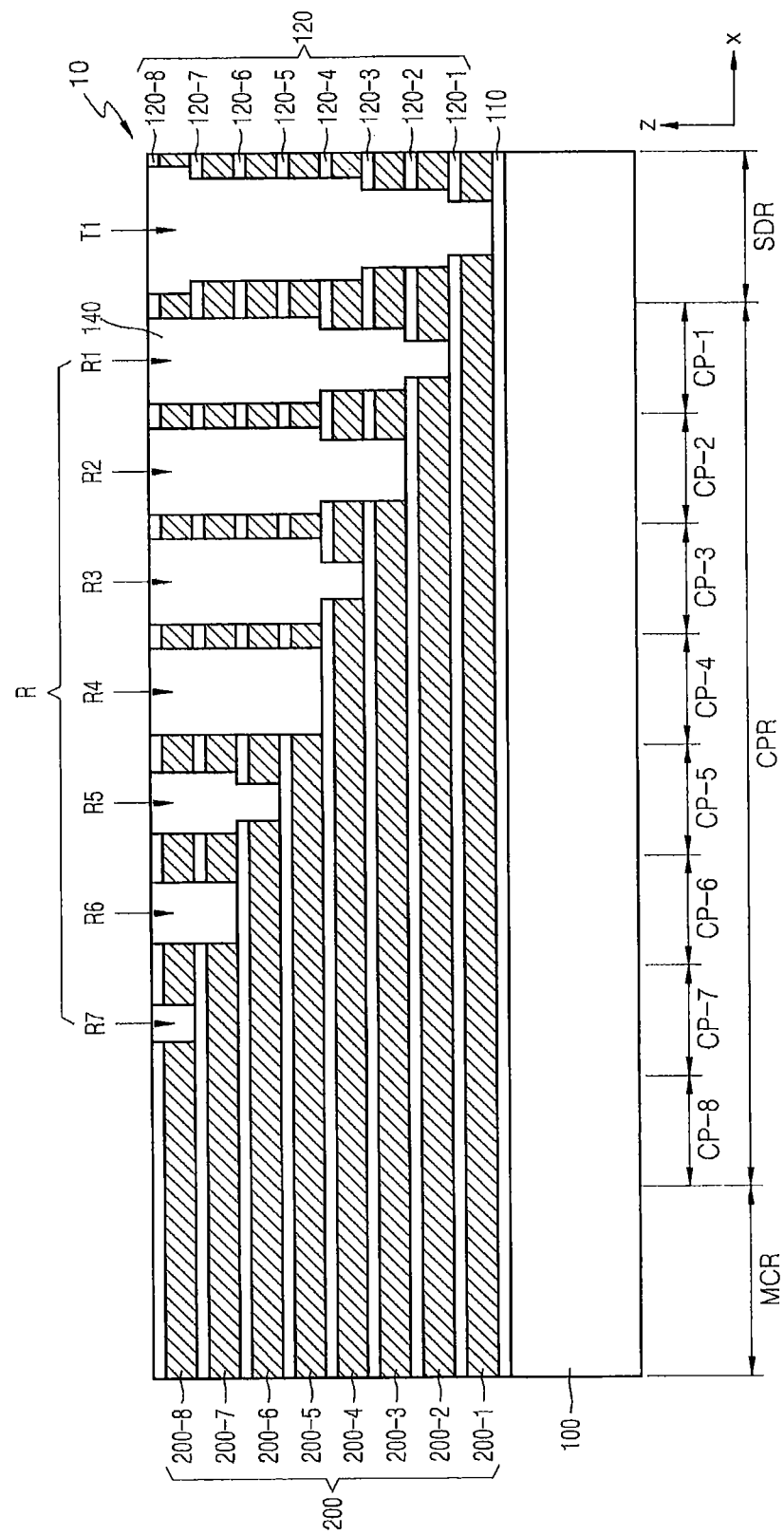
FIG. 7 is a cross-sectional view illustrating a process of forming a buried insulating layer for fabricating a semiconductor device according to some embodiments of the inventive concept.

Referring to FIG. 7, a buried insulating layer 140 is formed to fill the first recesses R1 through R7. $2^n-1$ buried insulating layers 140 filled in the $2^n-1$ first recesses R1 through R7 may be called a buried insulating layer group. If the second recess T1 is formed, the buried insulating layer 140 may be formed so as to fill the second recess T1. The buried insulating layer 140 may be formed through a planarization process after depositing buried insulating material (not shown) covering the stacked structure 10 and filling the first recesses R1 through R7 and/or the second recess T1. In FIG. 7, the case where the uppermost deposited insulating layer 120-8 is exposed after the buried insulating layer 140 is formed is illustrated. However, the buried insulating layer 140 may be formed so as to cover the uppermost deposited insulating layer 120-8. The buried insulating layer 140, for example, may be formed of oxide. The buried insulating layer 140 may be formed of a material having the same etch selectivity as or a similar etch selectivity to that of deposited insulating layers 120.

FIGS. 8 through 11 illustrate methods of forming a first recess for fabricating semiconductor devices according to a modification of some embodiments of the inventive concept.

The same contents as already explained with regard to FIGS. 3 through 6 will be omitted from the explanation of FIGS. 8 through 11.

Figure 8:
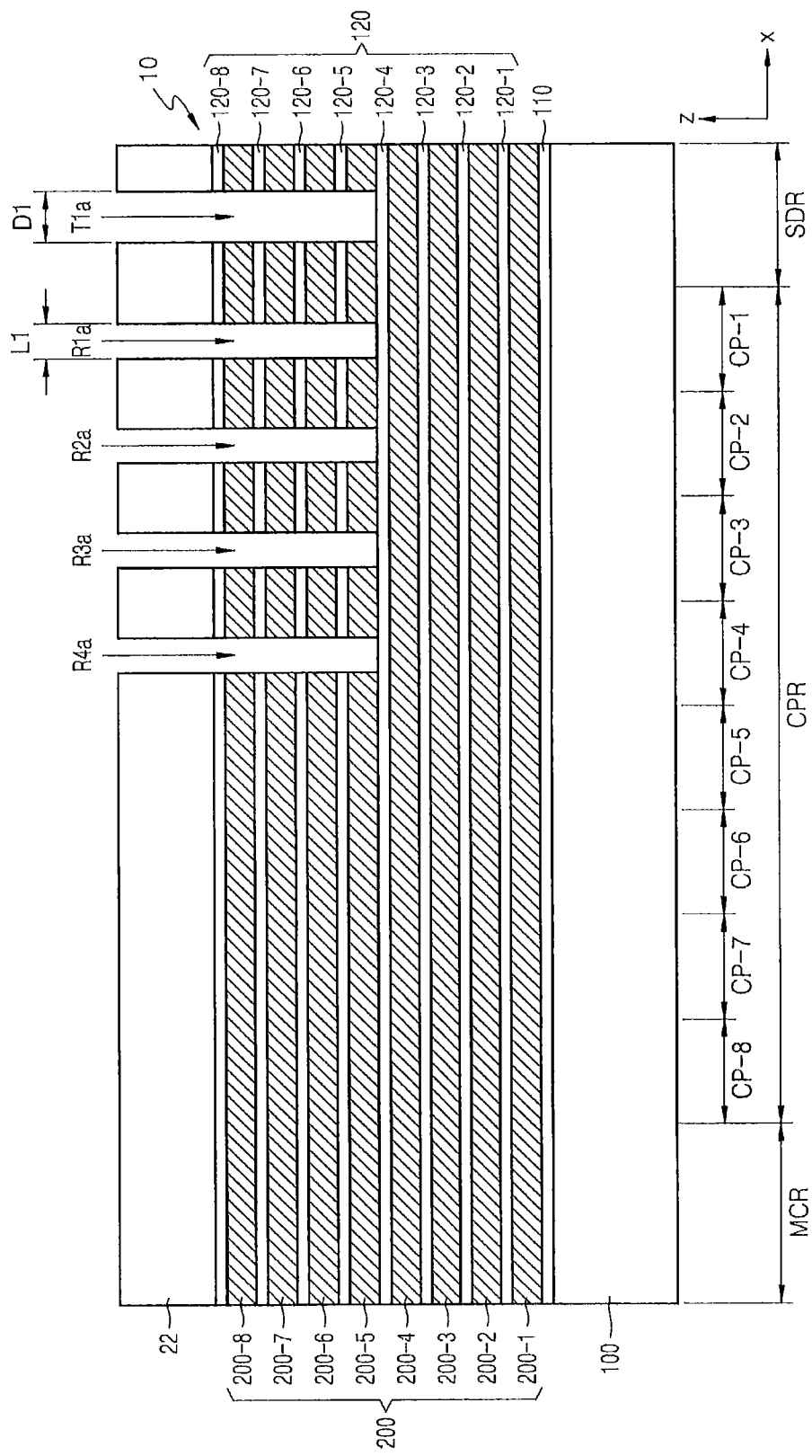
FIGS. 8 through 11 illustrate by operations a method of forming a first recess for fabricating a semiconductor device according to a modification of some embodiments of the inventive concept.
Figure 9:
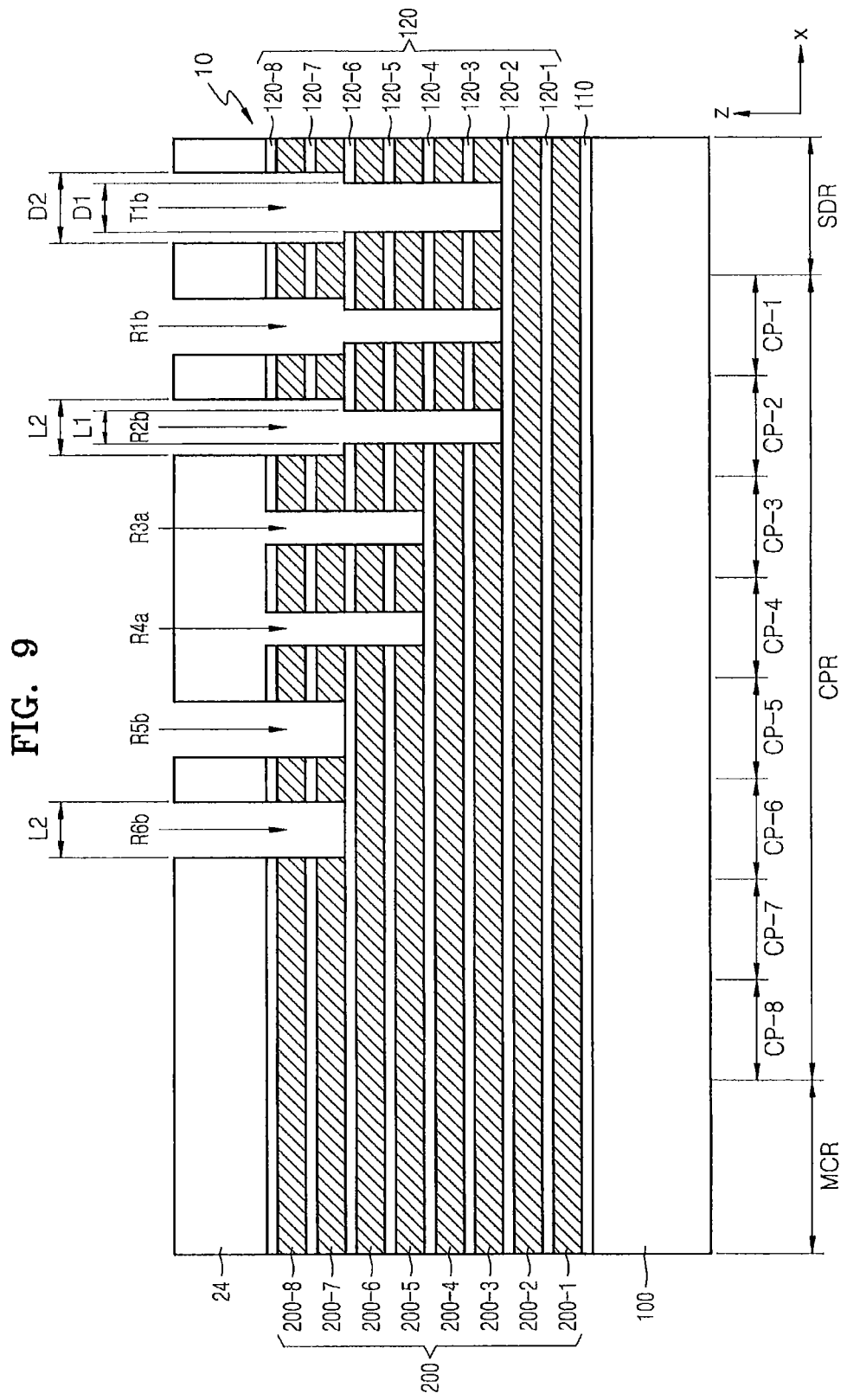
Figure 10:
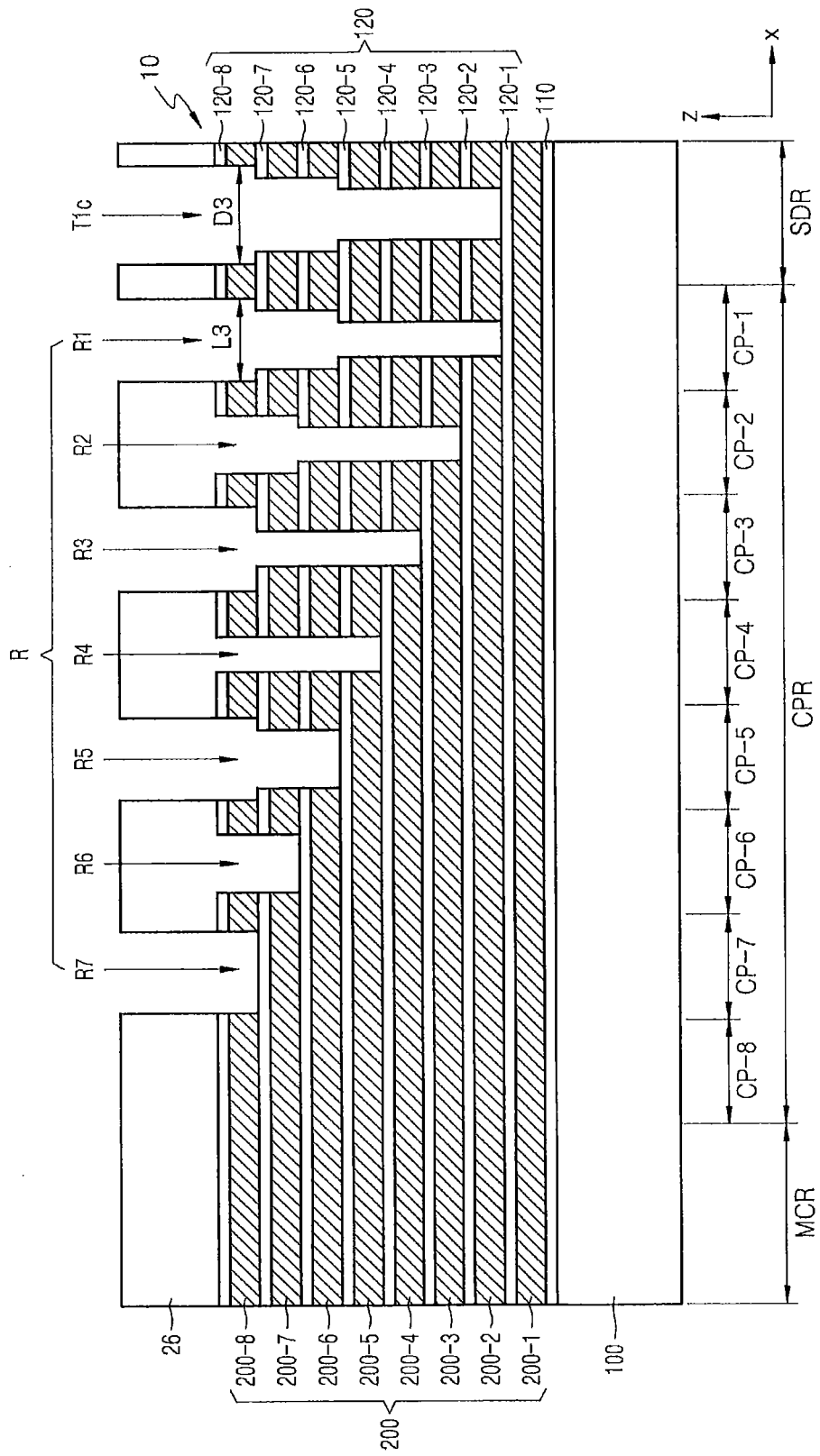

FIGS. 8 through 10 are cross-sectional views illustrating processes of performing first through third etch processes for fabricating semiconductor devices according to a modification of some embodiments of the inventive concept.

Referring to FIGS. 8 through 10, first through third photoresist patterns 22, 24, and 26 are formed and then the first through third etch process are performed. As stated above, the first through third etch processes illustrated in FIGS. 3 through 5 remove a portion of the stacked structure 10 so as to penetrate one of the deposited sacrificial layers 200, two of the deposited sacrificial layers 200, and four of the deposited sacrificial layers 200, respectively. On the other hand, the first through third etch processes illustrated in FIGS. 8 through 10 remove a portion of the stacked structure 10 so as to penetrate four of the deposited sacrificial layers 200, two of the deposited sacrificial layers 200, and one of the deposited sacrificial layers 200, respectively.

Referring to FIGS. 3 through 5 and 8 through 10, an etch process, which is preformed to penetrate $2^k$ deposited sacrificial layers 200, from among n-time etch processes, may be simultaneously performed in all of $2^k$ successive contact formation regions CP1 through CP-8 (here, k is an integer 0 through n–1).

As stated above, the first through third etch processes illustrated in FIGS. 3 through 5 are performed to penetrate one of the deposited sacrificial layers 200, two of the deposited sacrificial layers 200, and four of the deposited sacrificial layers 200, respectively, and the first through third etch processes illustrated in FIGS. 8 through 10 are performed to penetrate four of the deposited sacrificial layers 200, two of the deposited sacrificial layers 200, and one of the deposited sacrificial layers 200, respectively, but the inventive concept is not limited thereto. That is, the number of the deposited sacrificial layers 200 penetrated in each of the first through third etch processes may be $2^k$. For example, first through third etch processes may be performed to penetrate two of the deposited sacrificial layers 200, four of the deposited sacrificial layers 200, and one of the deposited sacrificial layers 200, respectively, or first through third etch processes may be performed to penetrate one of the deposited sacrificial layers 200, four of the deposited sacrificial layers 200, and two of the deposited sacrificial layers 200, respectively.

Figure 11:
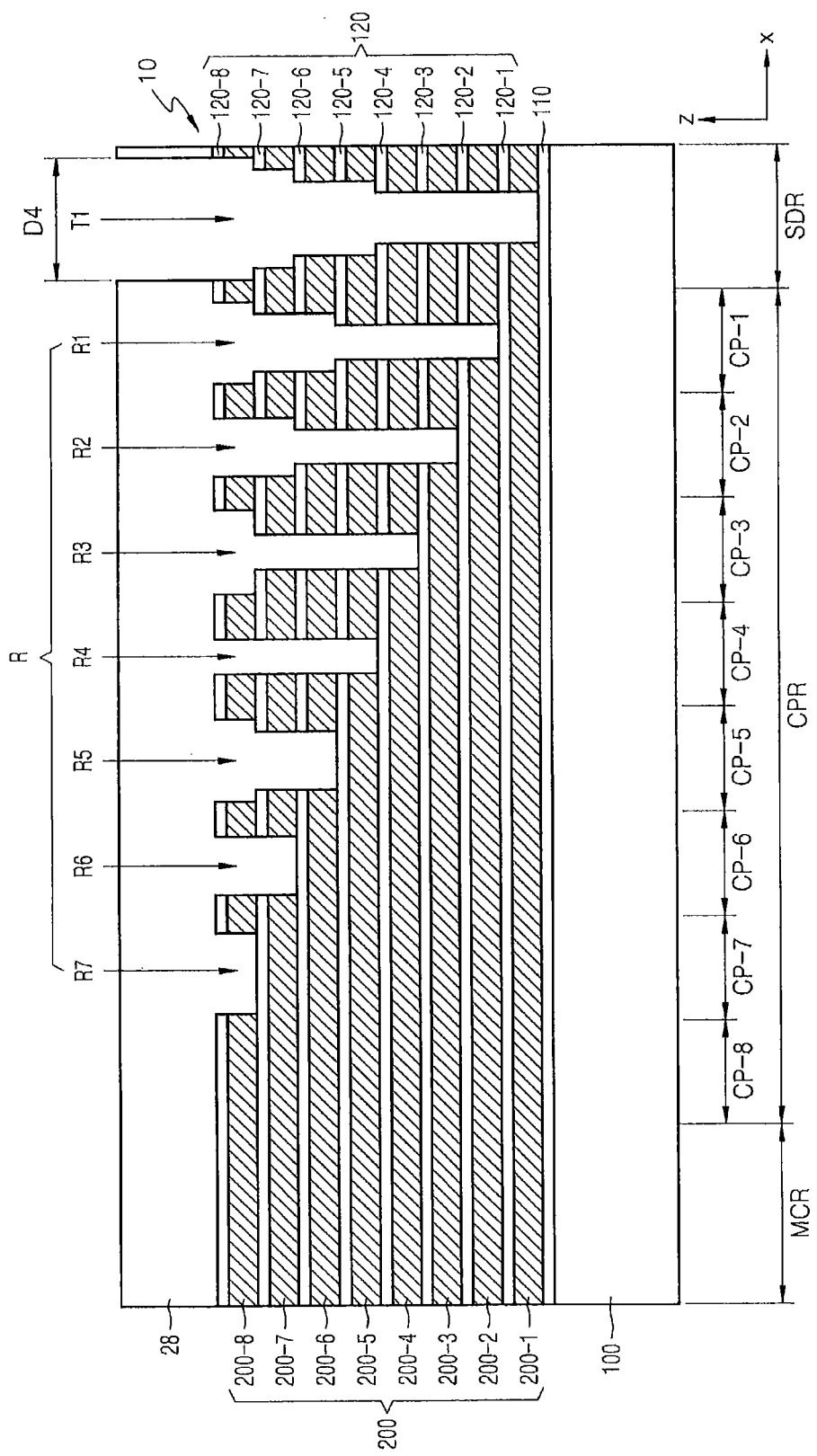

FIG. 11 is a cross-sectional view illustrating a process of performing a fourth etch process for fabricating semiconductor devices according to a modification of some embodiments of the inventive concept.

Referring to FIG. 11, as also illustrated in FIG. 6, the fourth etch process may be performed after forming a fourth photoresist pattern 28 so as to have an opening in a stack dividing region SDR. Here, the same explanations as already presented with respect to the fourth etch process illustrated in FIG. 6 will be omitted because the fourth etch process illustrated in FIG. 11 and the fourth etch process illustrated in FIG. 6 are the same as each other except a difference between the first through third etch processes illustrated in FIGS. 8 through 10 and the first through third etch processes illustrated in FIGS. 3 through 6.

Figure 12:
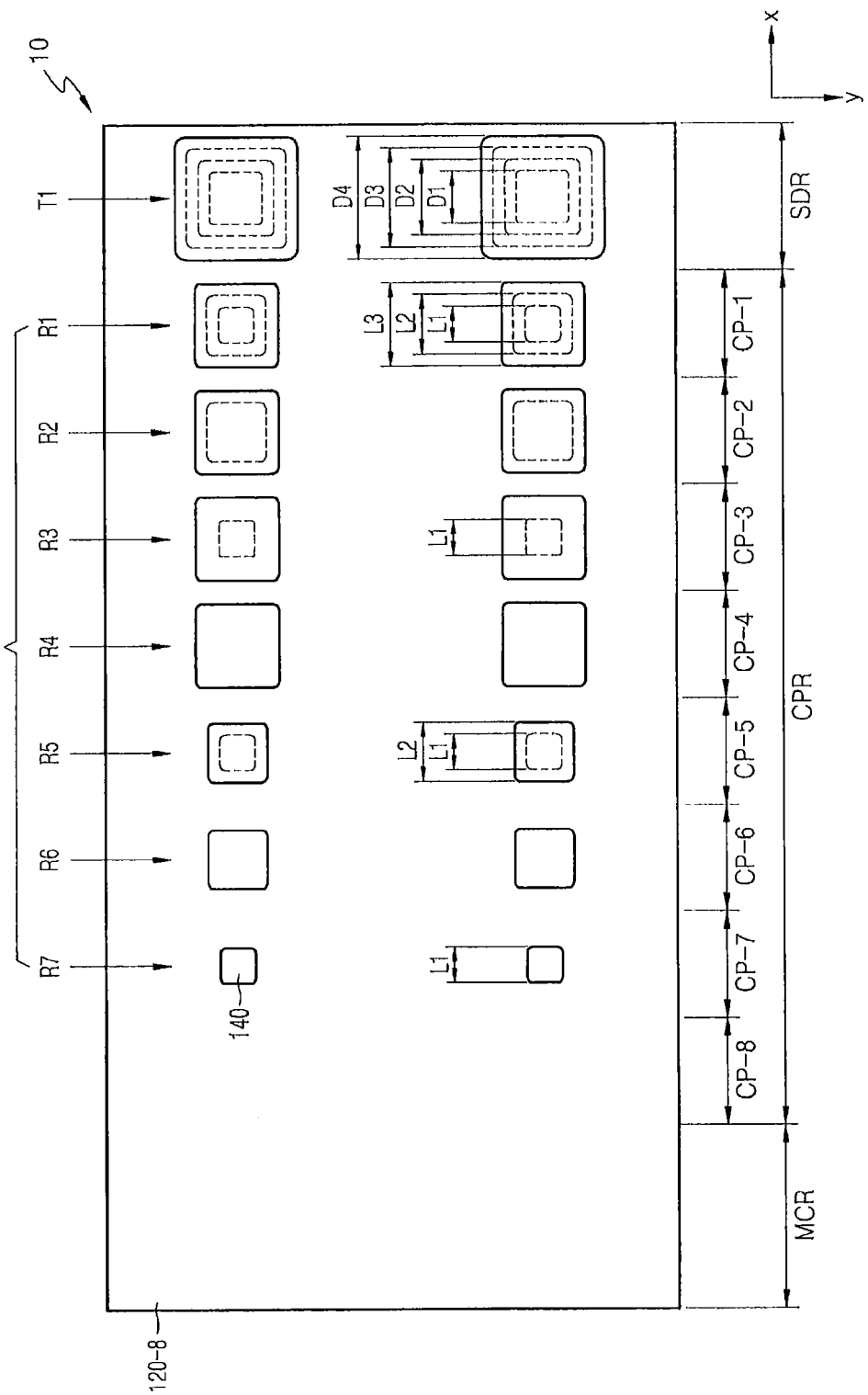
FIGS. 12 and 13 are plan views each illustrating a process of forming a buried insulating layer for fabricating a semiconductor device according to some embodiments of the inventive concept.

FIG. 12 is a plan view illustrating a process of forming a buried insulating layer 140 for fabricating semiconductor devices according to some embodiments of the inventive concept. In detail, FIG. 12 is a plan view corresponding to the cross-sectional view of FIG. 7.

Referring to FIG. 12, the buried insulating layer 140 filling first recesses R1 thorough R7 is formed. The first recesses R1 through R7 and/or a second recess T1 may be formed in a hole shape. That is, the 2"−1 first recesses R1 through R7 included in a recess group R may be formed in the hole shape. In addition, if a second recess T1 is formed, the buried insulating layer 140 may be formed so as to fill the second recess T1. The first recesses R1 through R3 formed through a plurality of etch processes from among the first recesses R1 through R7 may have a cross-sectional area which varies from an upper portion to a lower portion. For example, the first recess R1 formed through three times etch processes may have a cross-sectional area which varies, namely, decreases in the order of a third width L3, a second width L2, and a first width L1.

In addition, a plurality of recess groups R each including 2"−1 first recesses R1 through R7 may be formed. In this case, the plurality of recess groups R may be disposed in the second direction (the Y-axis direction).

Figure 13:
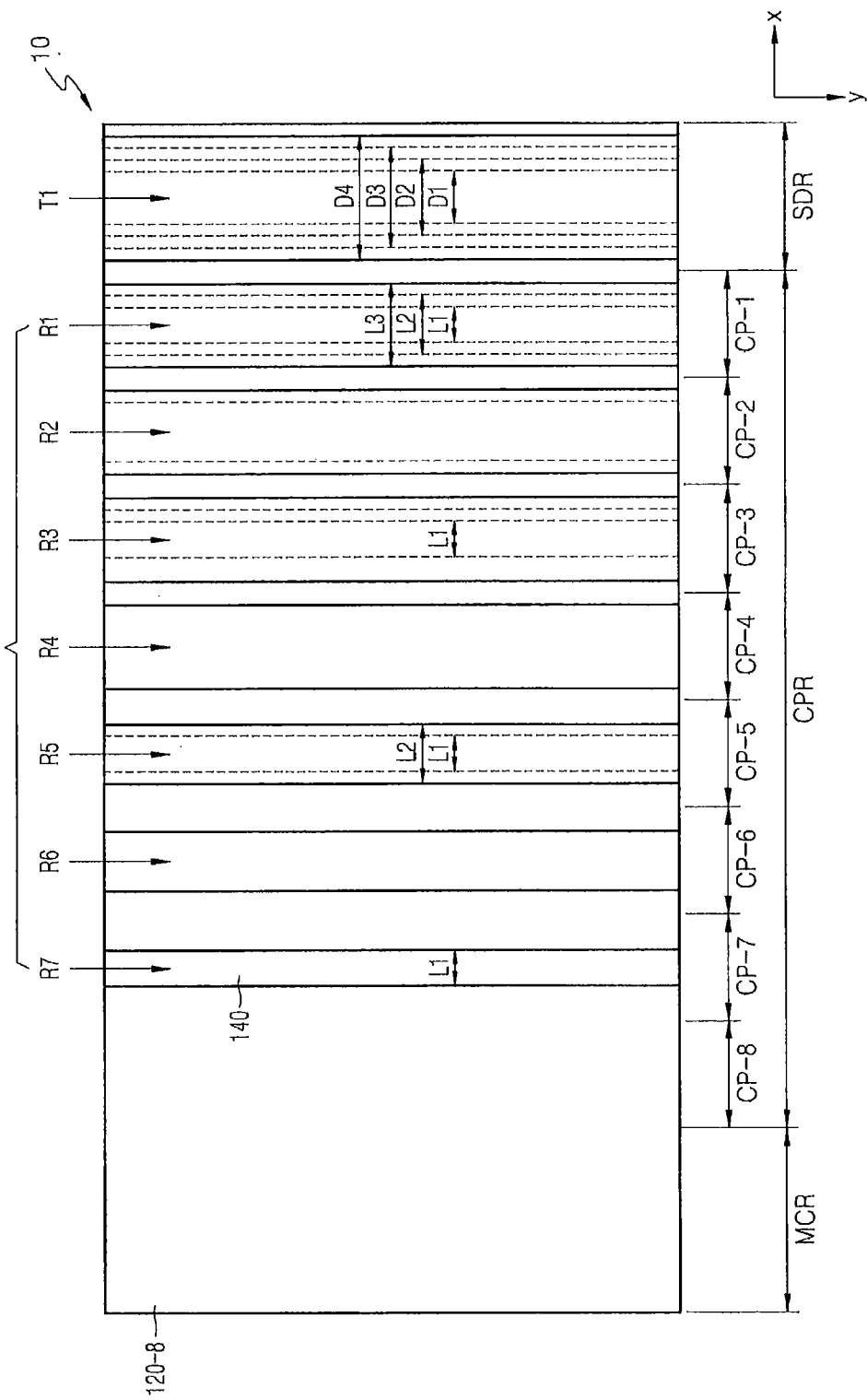

FIG. 13 is another plan view illustrating a process of forming a buried insulating layer 140 for fabricating semiconductor devices according to some embodiments of the inventive concept. In detail, FIG. 13 is another plan view corresponding to the cross-sectional view of FIG. 7.

Referring to FIG. 13, the buried insulating layer 140 filling first recesses R1 through R7 is formed. If a second recess T1 is formed, the buried insulating layer 140 may be formed so as to fill the second recess T1. The first recesses R1 through R7 and the second recess T1 may be formed in a line shape extending in the second direction (the Y-axis direction). That is, each of the 2"−1 first recesses R1 through R7 included in the recess group R may be formed in the line shape. The first recesses R1 through R3 and R5 formed through a plurality of etch processes from among the first recesses R1 through R7 may have a cross sectional area which varies from an upper portion to a lower portion. For example, the first recess R1 formed through three-time etch processes may have a cross sectional area which varies, namely, decreases in the order of a third width L3, a second width L2, and a first width L1.

FIGS. 14 through 18 illustrate methods of forming a buried insulating layer for fabricating semiconductor devices according to another modification of some embodiments of the inventive concept. The same contents as already explained with regard to FIGS. 3 through 7 will be omitted from the explanation of FIGS. 14 through 18.

Figure 14:
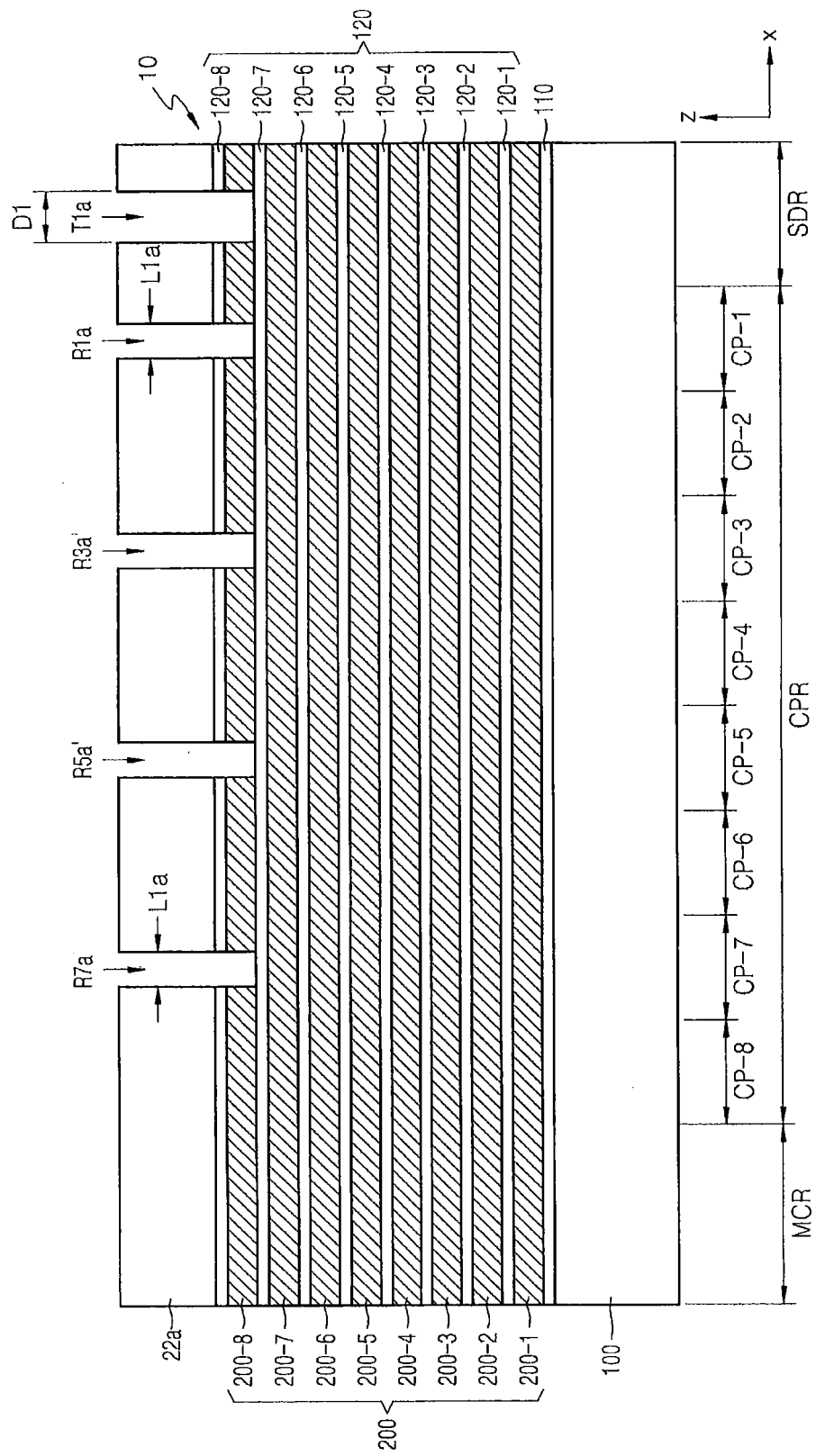
FIGS. 14 through 18 illustrate by steps a method of forming a buried insulating layer for fabricating a semiconductor device according to another modification of some embodiments of the inventive concept.
Figure 15:
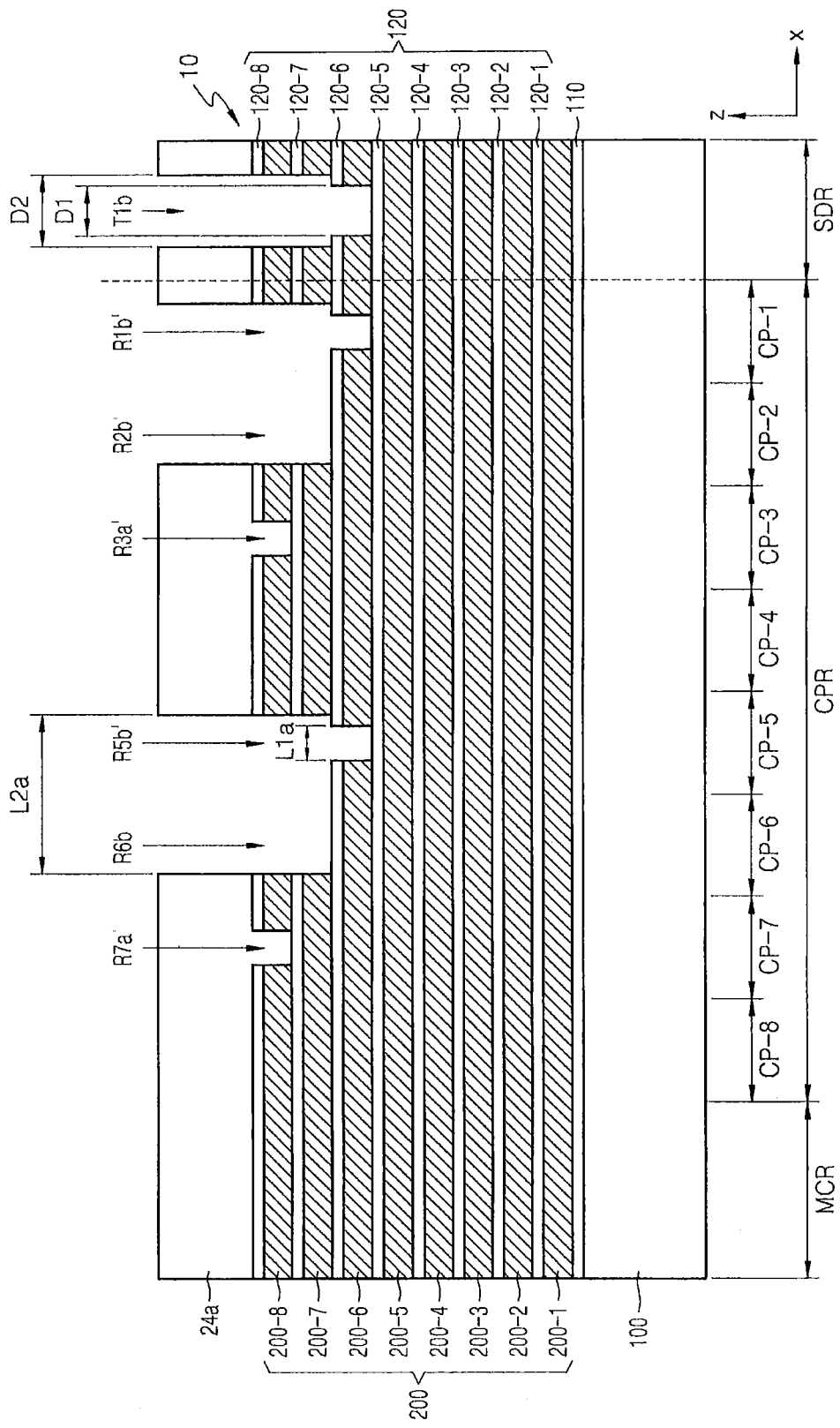
Figure 16:
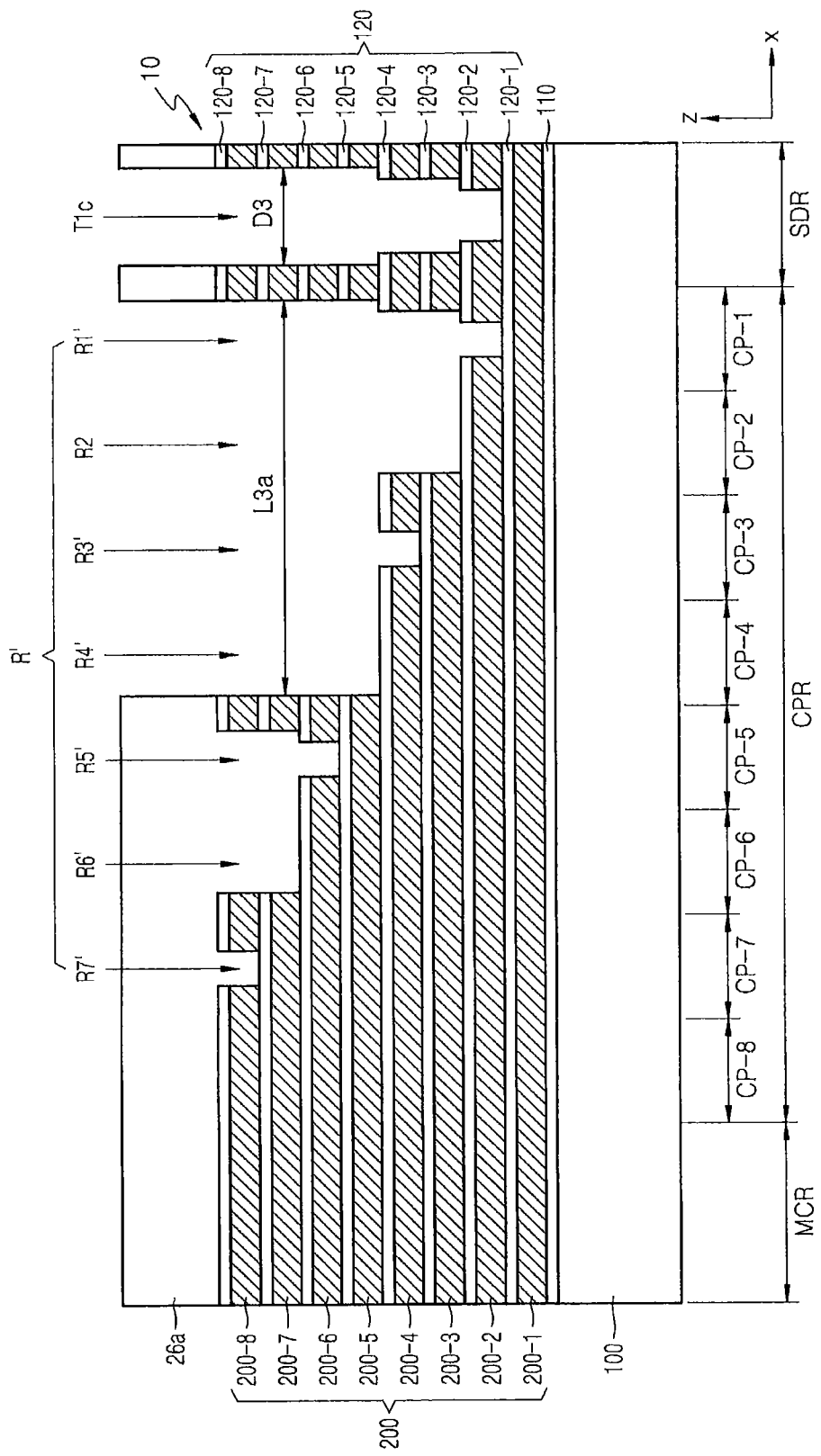

FIGS. 14 through 16 are cross-sectional views illustrating processes for performing first through third etch processes for fabricating semiconductor devicea according to another modification of some embodiments of the inventive concept.

Referring to FIGS. 14 through 16, the first etch process performed using a first photoresist pattern 22a as an etch mask may be the same as the first etch process illustrated in FIG. 3. The second etch process using a second photoresist pattern 24a may have a difference in a shape of the second photoresist pattern 24a compared to the second etch process using the second photoresist pattern 24 illustrated in FIG. 4.

In detail, in the second photoresist pattern 24 illustrated in FIG. 4, a separate opening is formed in each of two successively adjacent contact formation regions CP-1 and CP-2, and CP-5 and CP-6. However, in the second photoresist pattern 24a illustrated in FIG. 15, a single united opening is formed in two successively adjacent contact formation regions CP-1 and CP-2, and CP-5 and CP-6. Accordingly, two second preliminary recesses R1a' and R2a', and R5a' and R6a' formed in the two successively adjacent contact formation regions CP-1 and CP-2, and CP-5 and CP-6, from among second preliminary recesses R1a', R2a', R5a', and R6a' formed by the second etch process, may be formed so as to be connected to each other. A portion into which the two second preliminary recesses R1a' and R2a' are united and a portion into which the two second preliminary recesses R5a' and R6a' are united may have a second width L2a. The second width L2a may be equal or approximately equal to a value in which a width between the two adjacent second preliminary recesses R1a' and R2a' or R5a' and R6a' illustrated in FIG. 4 is added to double of the second width L2 illustrated in FIG. 4.

In the third photoresist pattern 26 illustrated in FIG. 5, an opening is formed in each of the four adjacent contact formation regions CP-1 through CP-4. However, in the third photoresist pattern 26a illustrated in FIG. 16, a united single opening is formed in the four successively adjacent contact formation regions CP-1 through CP-4. Accordingly, the first recesses R1', R2', R3', and R4' formed by the third etch process may be formed so as to be connected to each other. A portion into which the four first recesses R1', R2', R3', and R4' are united may have a third width L3a, and the third width L3a may be equal or approximately equal to the total of widths of the four first recesses R1', R2', R3', and R4' formed in FIG. 5.

Accordingly, seven first recesses R1' through R7' may be formed so as to have a shape in which the two first recesses R1' and R2' are united, the four first recesses R1', R2', R3', and R4' are united, and the one first recess R7' is separated from the others.

Figure 17:
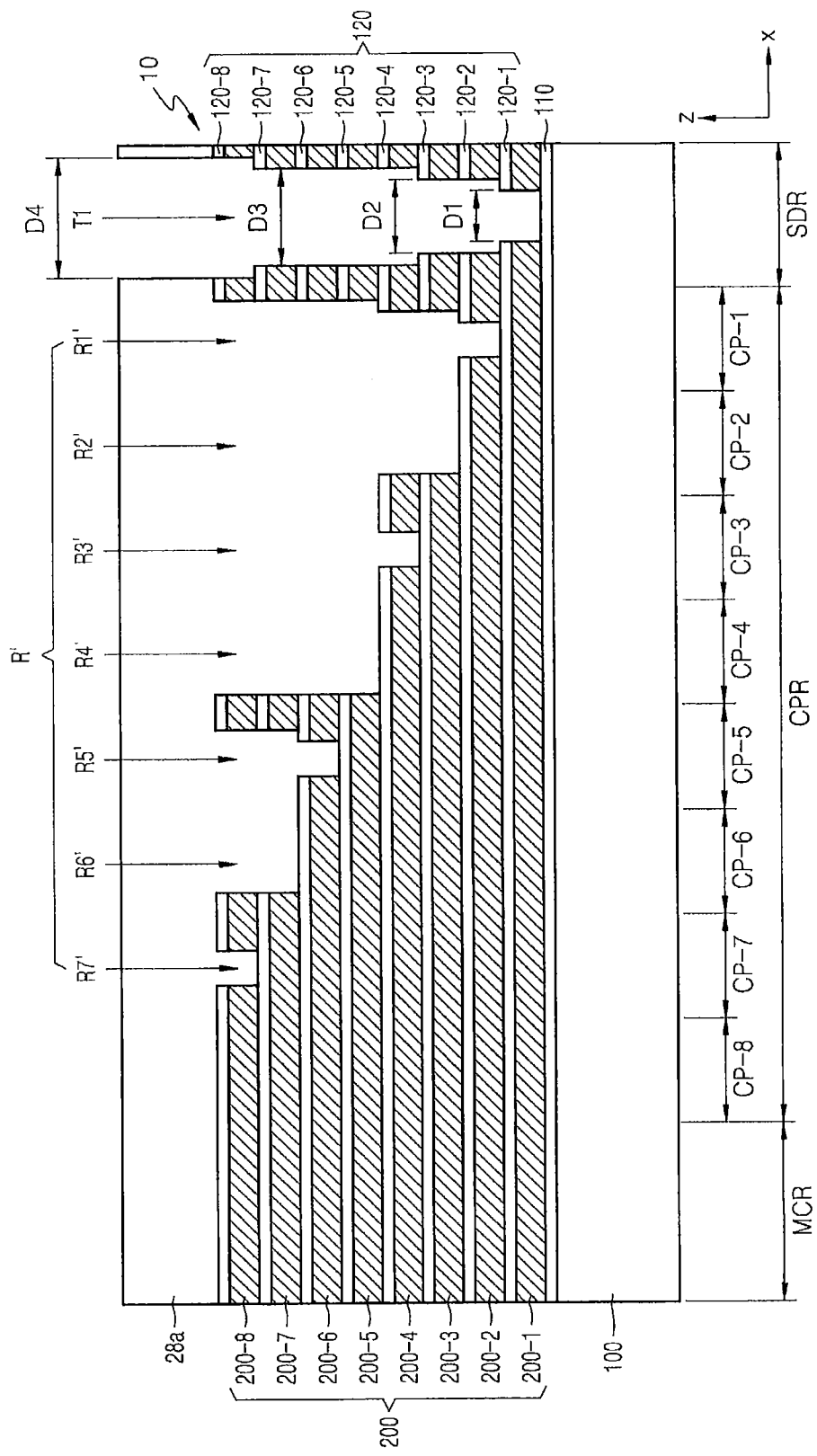

FIG. 17 is a cross-sectional view illustrating a process of performing a fourth etch process for fabricating semiconductor devices according to another modification of some embodiments of the inventive concept.

Referring to FIG. 17, as also illustrated in FIG. 6, the fourth etch process may be performed after forming fourth photoresist pattern 28a so as to have an opening in a stack dividing region SDR. Here, the same explanations as already presented with respect to FIG. 6 will be omitted because the fourth etch process illustrated in FIG. 17 and the fourth etch process illustrated in FIG. 6 are the same as each other except a difference between the first through third etch processes illustrated in FIGS. 14 through 16 and the first through third etch processes illustrated in FIGS. 3 through 5.

Figure 18:
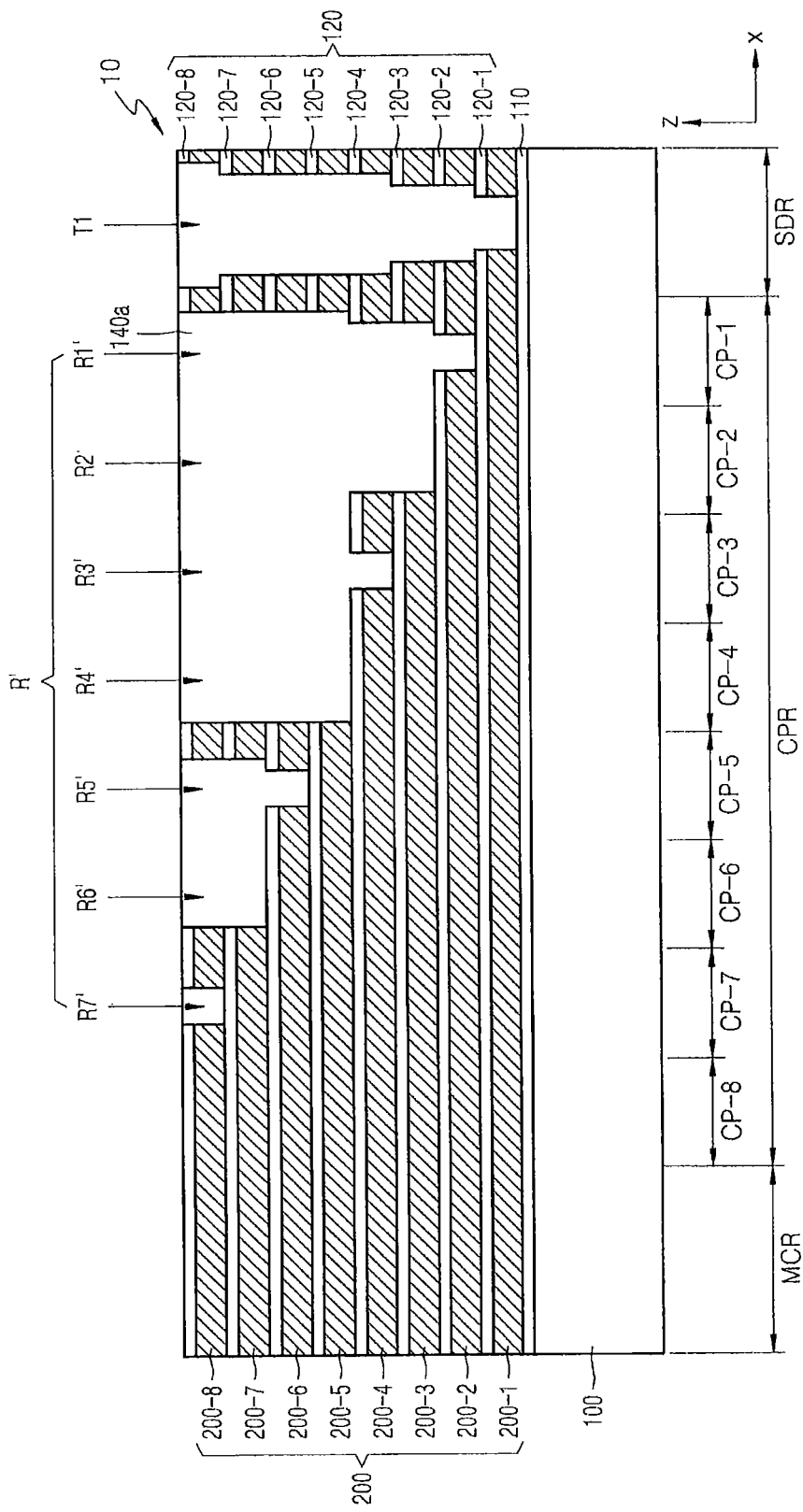

FIG. 18 is a cross-sectional view illustrating a process of forming a buried insulating layer 140a for fabricating semiconductor devices according to another modification of some embodiments of the inventive concept.

Referring to FIG. 18, as also illustrated in FIG. 7, the buried insulating layer 140a is formed so as to fill first recesses R1 thorough R7. If a second recess T1 is formed, the buried insulating layer 140a may be formed so as to fill the second recess T1. Here, the same explanations as already presented with respect to FIG. 7 will be omitted because the buried insulating layer 140a illustrated in FIG. 18 and the buried insulating layer 140 illustrated in FIG. 7 are the same as each other except a difference between the first through fourth etch processes illustrated in FIGS. 14 through 17 and the first through fourth etch processes illustrated in FIGS. 3 through 6.

Figure 19:
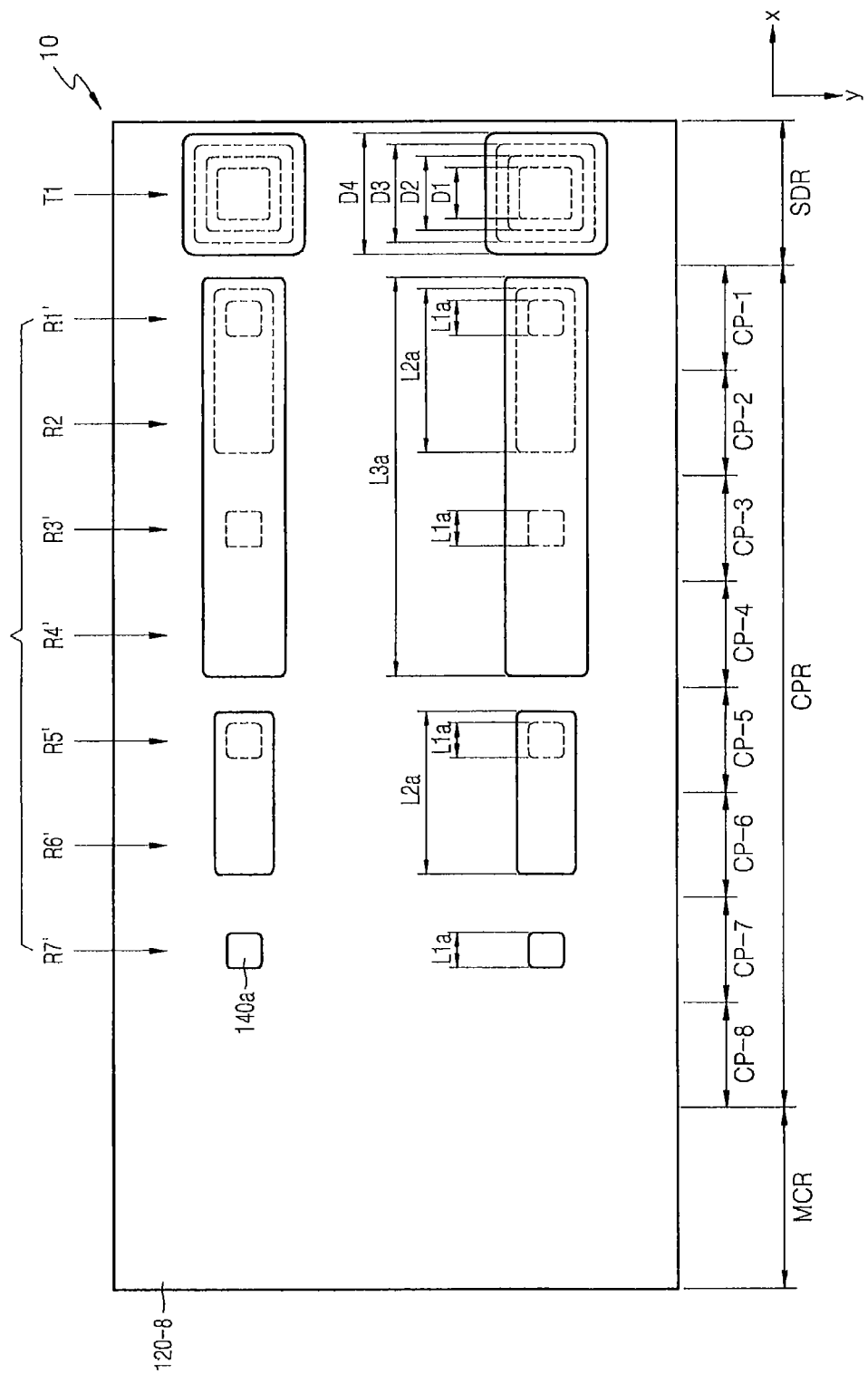
FIG. 19 is a plan view illustrating a process of forming a buried insulating layer for fabricating a semiconductor device according to another modification of some embodiments of the inventive concept.

FIG. 19 is a plan view illustrating a process of forming a buried insulating layer 140a for fabricating semiconductor devices according to another modification of some embodiments of the inventive concept. In detail, FIG. 19 is a plan view corresponding to the cross-sectional view of FIG. 18.

Referring to FIG. 19, the buried insulating layer 140a filling first recesses R1' thorough R7' is formed. In addition, if a second recess T1 is formed, the buried insulating layer 140a may be formed so as to fill the second recess T1. The first recesses R1' through R7' and/or the second recess T1 may be formed in a pad shape. The first recesses R1' through R3' and R5' formed through a plurality of etch processes from among the first recesses R1' through R7' may have a cross-sectional area which varies from an upper portion to a lower portion. The seven first recesses R1' through R7' may be formed so as to have a shape in which the four first recesses R1' through R4' are united and the two first recesses R5' and R6' are united.

That is, $2^n-1$ first recesses R1' through R7' included in a recess group R' may be formed so that $2^1$ first recesses are united, $2^{n-1}$, for example, $2^2$ first recesses are united, and $2^0$ first recess is separated from the other recesses.

FIGS. 20 through 24 are cross-sectional views and a perspective view illustrating processes of forming a non-volatile memory cell array according to some embodiments of the inventive concept.

Figure 20:
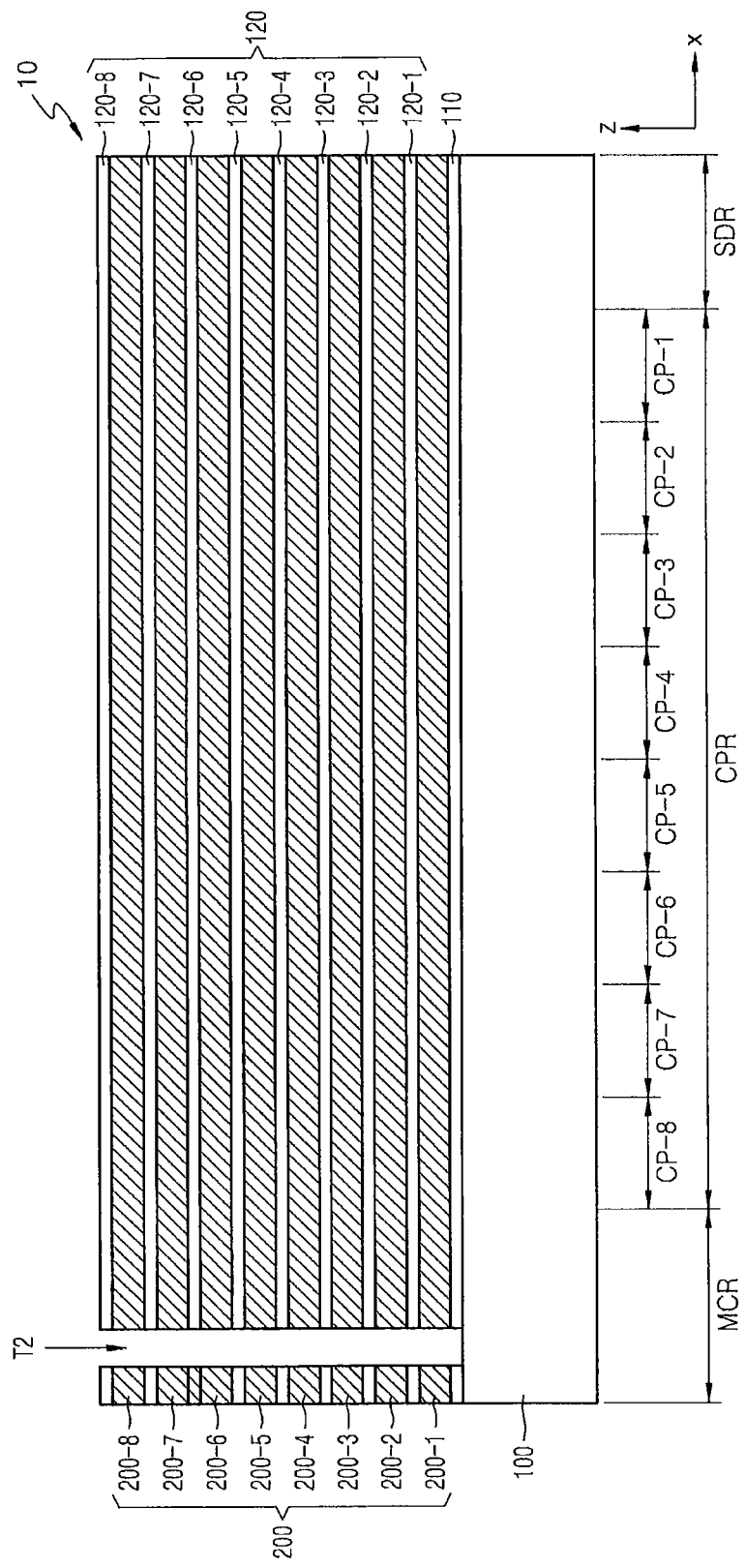
FIGS. 20 through 24 are cross-sectional views and a perspective view, illustrating processes of forming a non-volatile memory cell array according to some embodiments of the inventive concept.

FIG. 20 is a cross-sectional view illustrating a process of forming a third recess T2 according to some embodiments of the inventive concept.

Referring to FIG. 20, the third recess T2 exposing an upper surface of a substrate 100 is formed by removing portions of a stacked structure 10 and a base insulating layer 110 by using a photolithography process. The third recess T2 may be formed so as to have a hole shape. In addition, the third recess T2 may be disposed in a matrix form having rows and columns.

Figure 21:
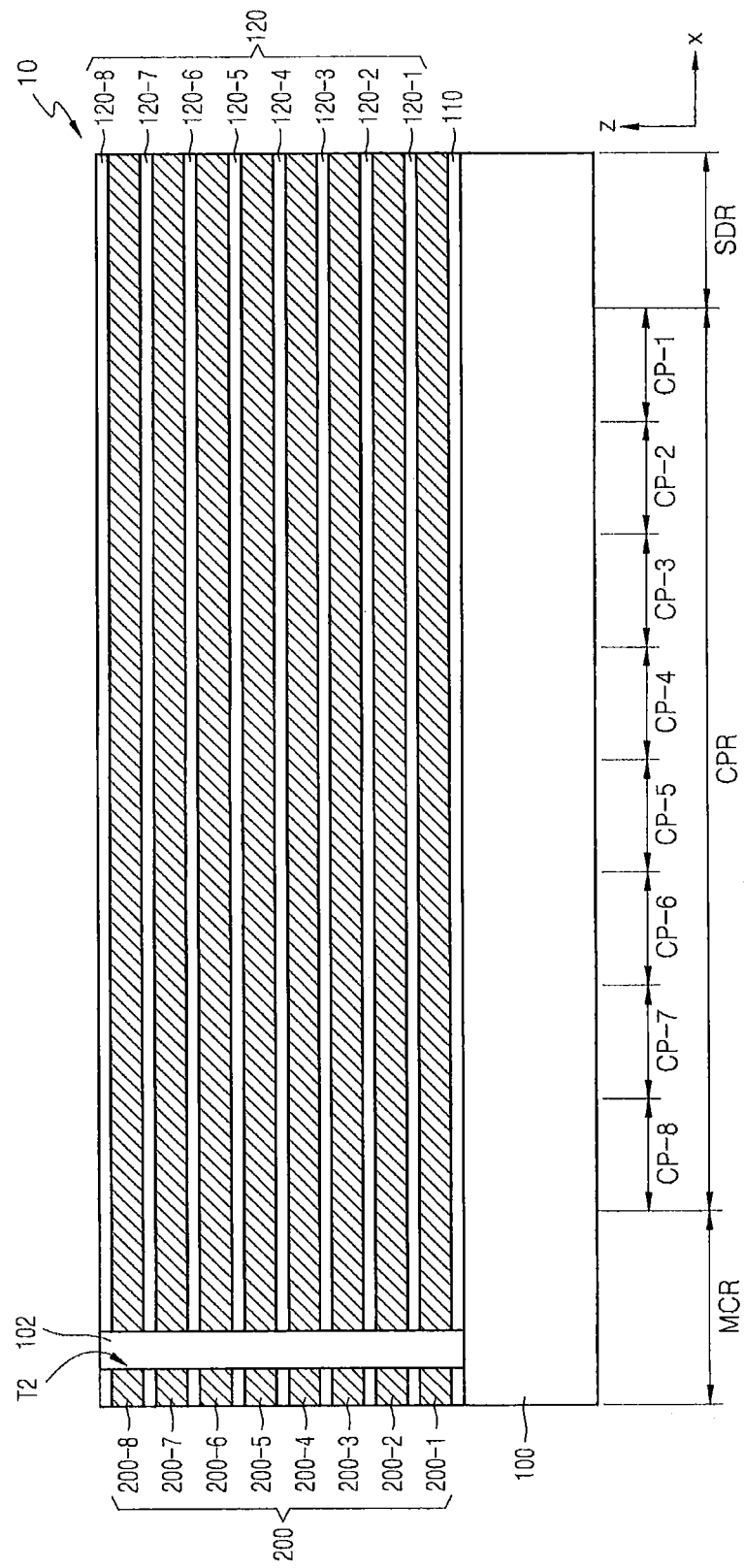

FIG. 21 is a cross-sectional view illustrating a process of forming a channel region 102 according to some embodiments of the inventive concept.

Referring to FIG. 21, the channel region 102 including a semiconductor material is formed in the third recess T2. The channel region 102 may be formed of the semiconductor material entirely. In addition, the channel region 102 may be formed by forming the semiconductor material so as to wrap an internal surface of the third recess T2 and then filling another material in a remaining space of the third recess T2.

In FIGS. 20 through 21, it is illustrated that the first recess group R or R' and/or the second recess T1, and the buried insulating layer 140 illustrated in FIGS. 7, 12, 13, 18, and 19 are not formed. However, the order of forming the channel region 102 the buried insulating layer 140 is not limited. That is, the buried insulating layer 140 may be formed after forming the channel region 102, or the channel region 102 may be formed after forming the buried insulating layer 140.

Figure 22:
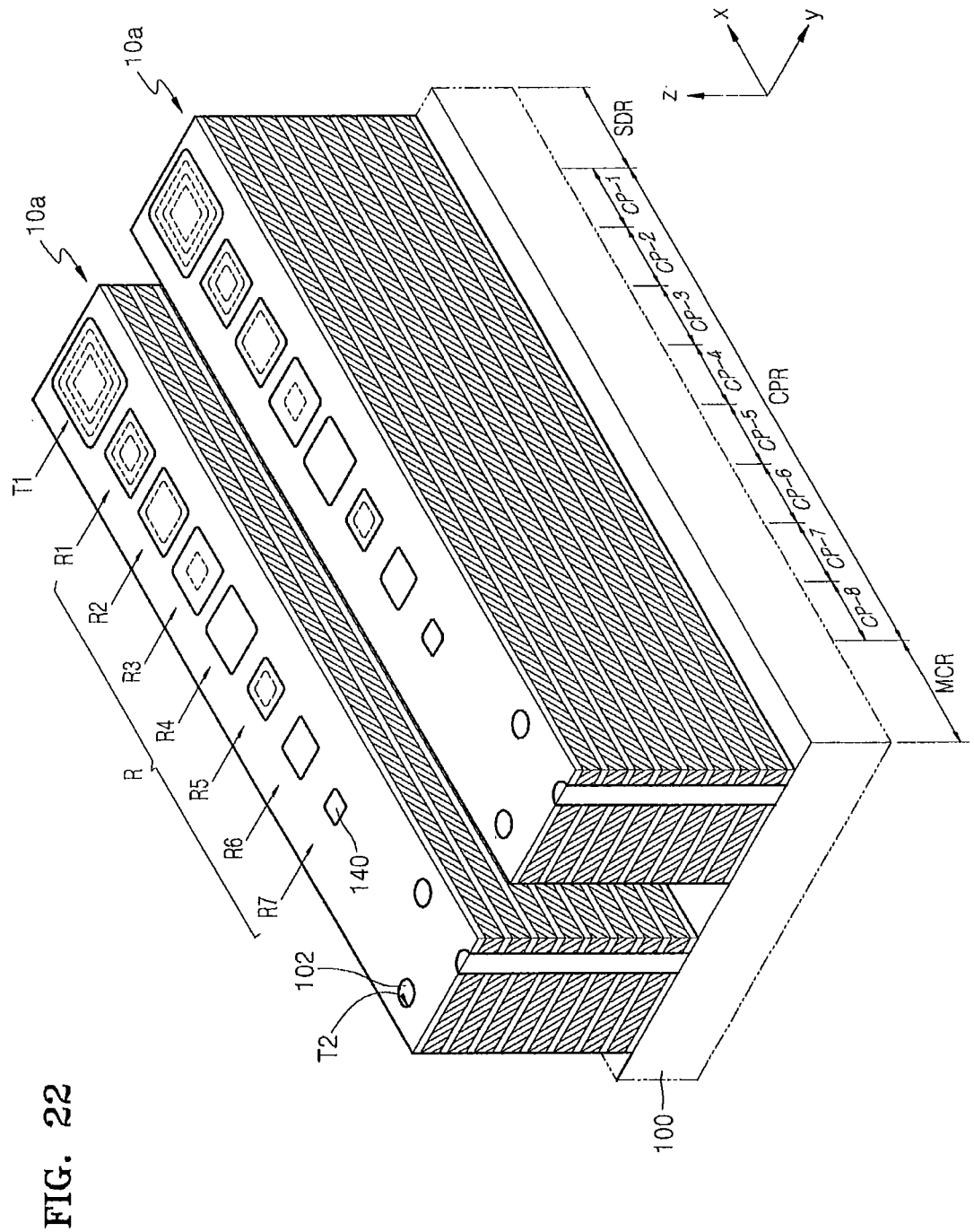

FIG. 22 is a perspective view illustrating a process of forming a divided stacked structure 10a according to some embodiments of the inventive concept.

Referring to FIG. 22, a stacked structure 10 illustrated in FIG. 21 is divided into a plurality of divided stacked structures 10a extending in a first direction (the X-axis direction). A substrate 100 may be exposed by removing a portion of the stacked structure 10 illustrated in FIG. 21 to form the plurality of divided stacked structures 10a. Each of the divided stacked structures 10a may include a first recess group R and a buried insulating layer 140. In addition, each of the divided stacked structures 10a may include a second recess T1 filled with the buried insulating layer 140. The stacked structure 10 may be divided into the plurality of divided stacked structures 10a after forming the channel region 102 and the buried insulating layer 140.

Figure 23:
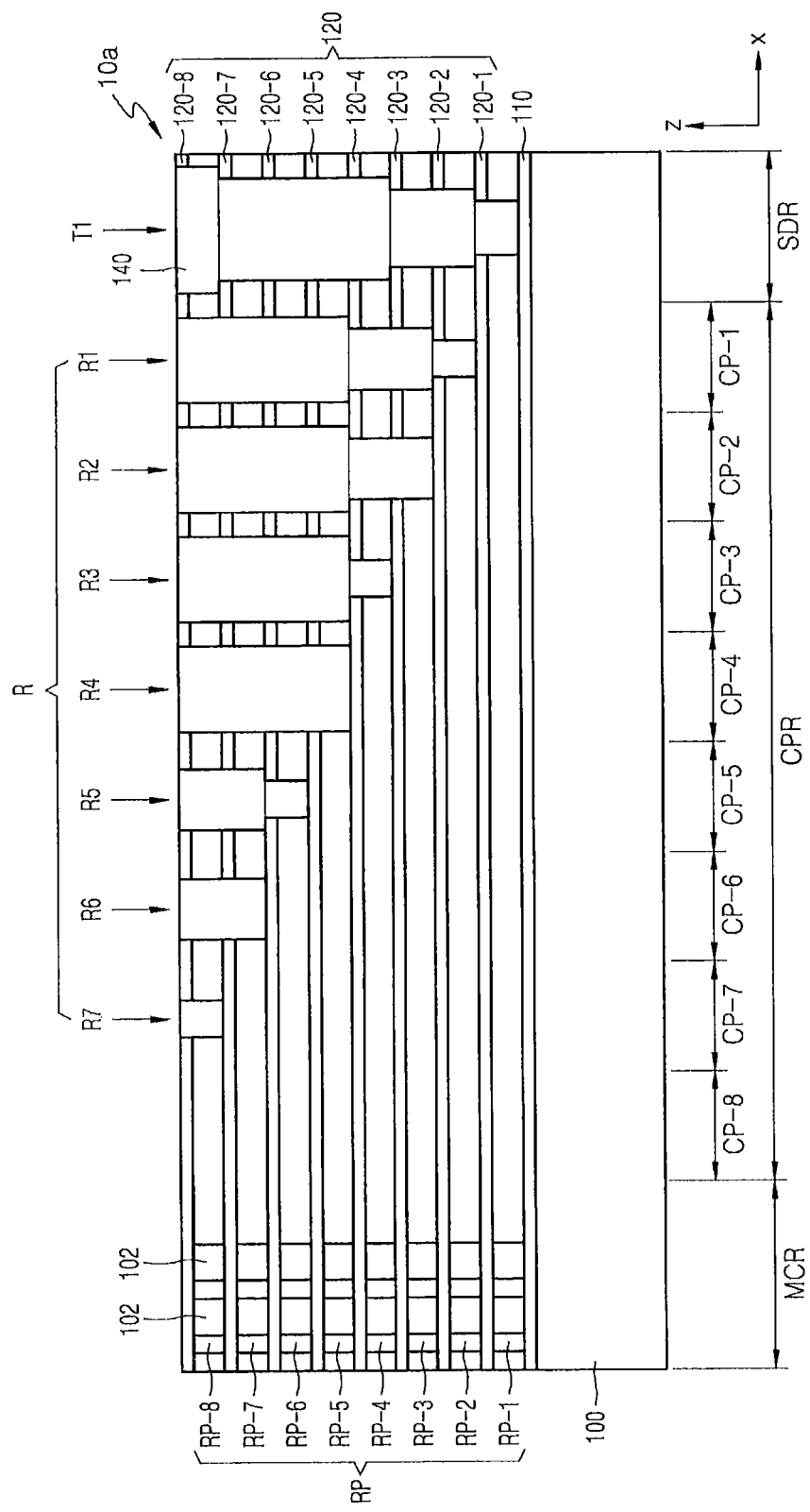

FIG. 23 is a perspective view in a second direction (the Y-axis direction), illustrating a process of removing deposited sacrificial layers 200 in the divided stacked structure 10a of FIG. 22, according to some embodiments of the inventive concept.

Referring to FIG. 23, the deposited sacrificial layers 200 included in the divided stacked structure 10a are removed. For example, an isotropic etch process may be used to remove the deposited sacrificial layers 200. Spaces in which the deposited sacrificial layers 200 are removed may be referred to as replacement spaces RP. Replacement spaces RP, namely, RP-1 through RP-8 correspond to spaces in which the deposited sacrificial layers 200, namely, 200-1 through 200-8, are removed, respectively.

As the deposited sacrificial layers 200 are removed, in the divided stacked structure 10a, the replacement spaces RP exist between deposited insulating layers 120 and each of the deposited insulating layers 120-1 through 120-8 may be supported by the channel region 102 and the buried insulating layers 140.

Figure 24:
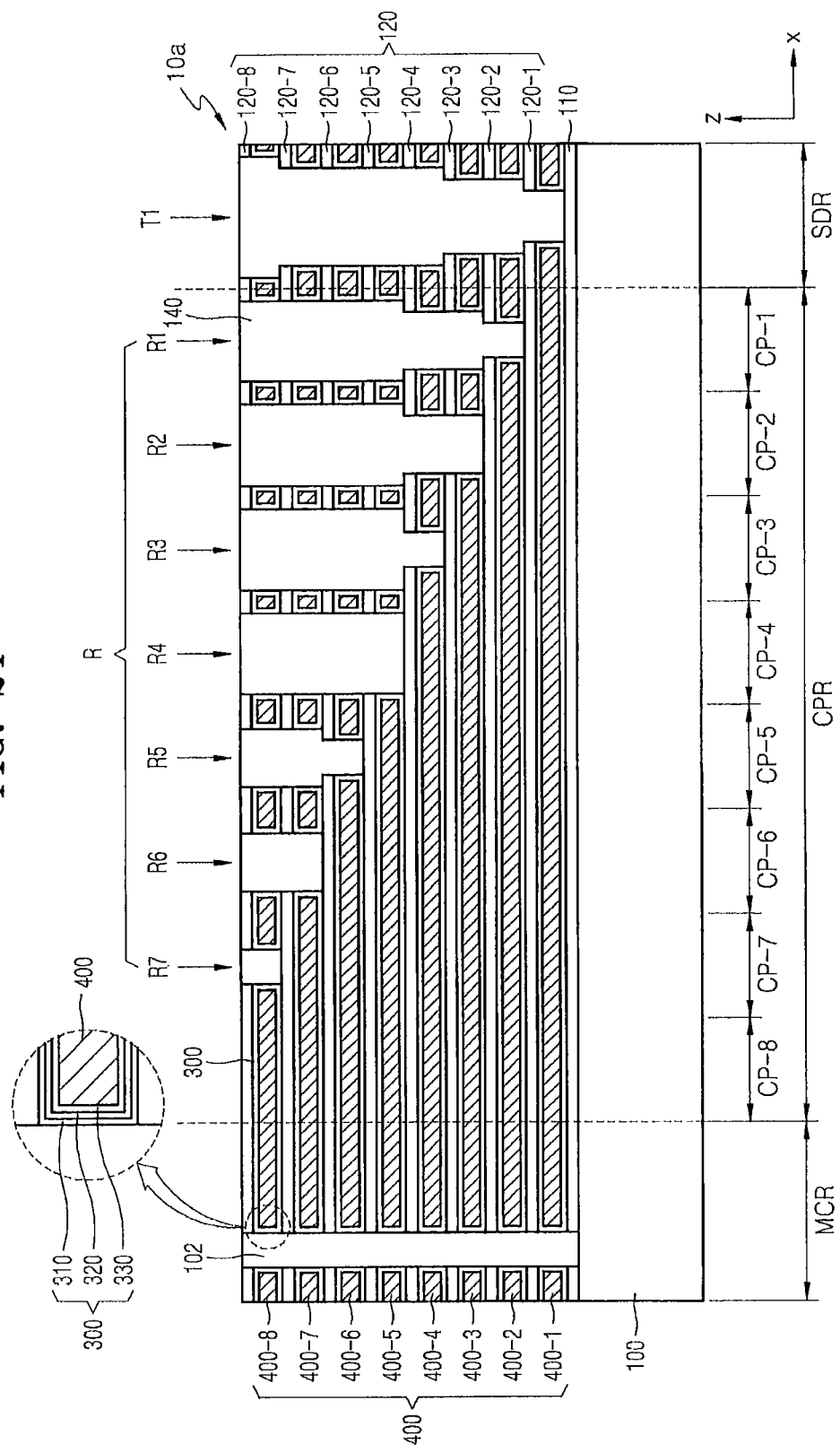

FIG. 24 is a cross-sectional view illustrating a process of forming a first conductive material 400 according to some embodiments of the inventive concept.

Referring to FIG. 24, the first conductive material 400 is formed in a portion or all of the replacement spaces RP-1 through RP-8 illustrated in FIG. 23. Here, before forming the first conductive material 400, a gate insulating film 300 may be formed on exposed surfaces of the replacement spaces RP-1 through RP-8. In particular, the gate insulating film 300 may include a tunneling insulating layer 310, a charge storing layer 320, and a blocking insulating layer 330 which may be sequentially deposited.

The first conductive material 400 may function as gate electrodes of memory cells, namely, word lines, or may function as selection lines of selection transistors. To form the first conductive material 400, after forming a first preliminary conductive material (not shown) on an exposed surface of the divided stacked structure 10a including the replacement spaces RP, an isotropic etch process may be performed so that the first preliminary conductive material remains substantially inside the replacement spaces RP without extending outside the replacement spaces RP.

First conductive materials 400-1 through 400-8 may be formed in the replacement spaces RP-1 through RP-8 respectively. The gate insulating film 300 formed on the channel region 102 and the first conductive material 400 formed on the gate insulating film 300 may constitute a non-volatile memory cell array.

Figure 25:
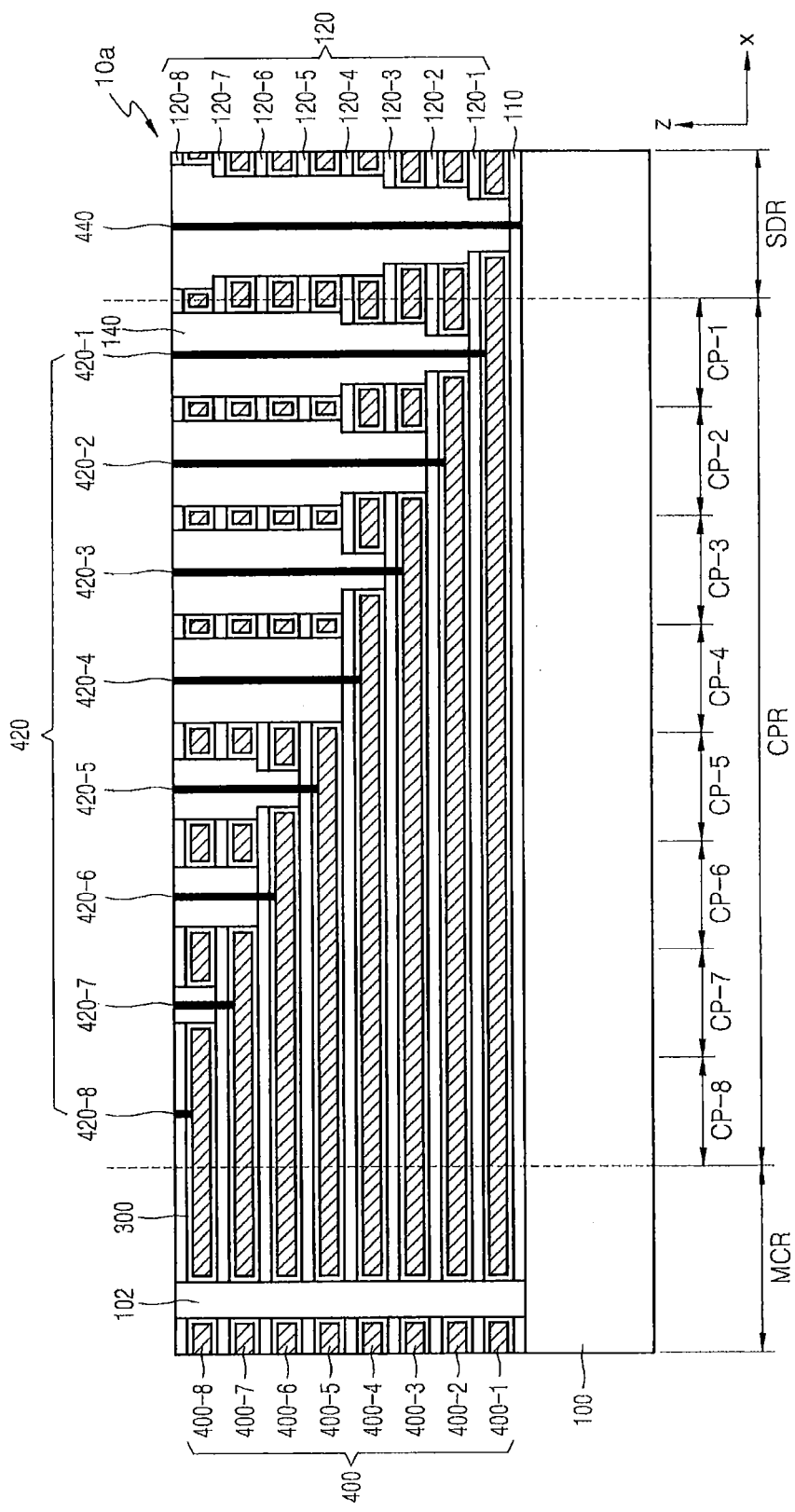
FIG. 25 is a cross-sectional view illustrating a process of forming a contact plug group according to some embodiments of the inventive concept.

FIG. 25 is a cross-sectional view illustrating a process of forming a plurality of contact plugs 420-1 through 420-8 according to some embodiments of the inventive concept.

Referring to FIG. 25, the plurality of contact plugs 420-1 through 420-8 are formed to penetrate a buried insulating layer 140. The contact plugs 420-1 through 420-8 may contact conductive materials 400-1 through 400-8 respectively by penetrating the gate insulating film 300 and a corresponding one of the deposited insulating layers 120-1 through 120-8, which are disposed between a lower side of buried insulating layer 140 and a corresponding one of the first conductive materials 400-1 through 400-8. Accordingly, the contact plugs 420-1 through 420-8 may function as contact plugs for the word lines and/or the selection lines by contacting the conductive materials 400-1 through 400-8 respectively. After forming contact holes (not shown) exposing the conductive materials 400 by penetrating the buried insulating layers 140 to form the contact plugs 420-1 through 420-8, second conductive material may be filled in the contact holes. An etch process using the first conductive materials 400 as etch stopping layers may be used to form the contact holes.

As illustrated above, if the $2^n$ deposited insulating layers 200-1 through 200-8 are formed, $2^n$ contact plugs 420-1 through 420-8 may be formed. The $2^n$ contact plugs 420-1 through 420-8 corresponding to the $2^n$ deposited insulating layers 200-1 through 200-8 may be called a contact plug group 420.

If the buried insulating layers 140 are formed also in the stack dividing region SDR, a selection contact plug 440 contacting a substrate 100 may be selectively formed. The selection contact plug 440 may be electrically connected to and/or conductive to the substrate 100, and thus, may function as a well contact plug for supplying a voltage to a well region (not shown) formed in the substrate 100. Although not illustrated, if the selection contact plug 440 is not formed in the buried insulating layers 140 formed in the stack dividing region SDR, the buried insulating layers 140 formed in the stack dividing region SDR may perform a function of separating memory cell blocks.

Figure 26:
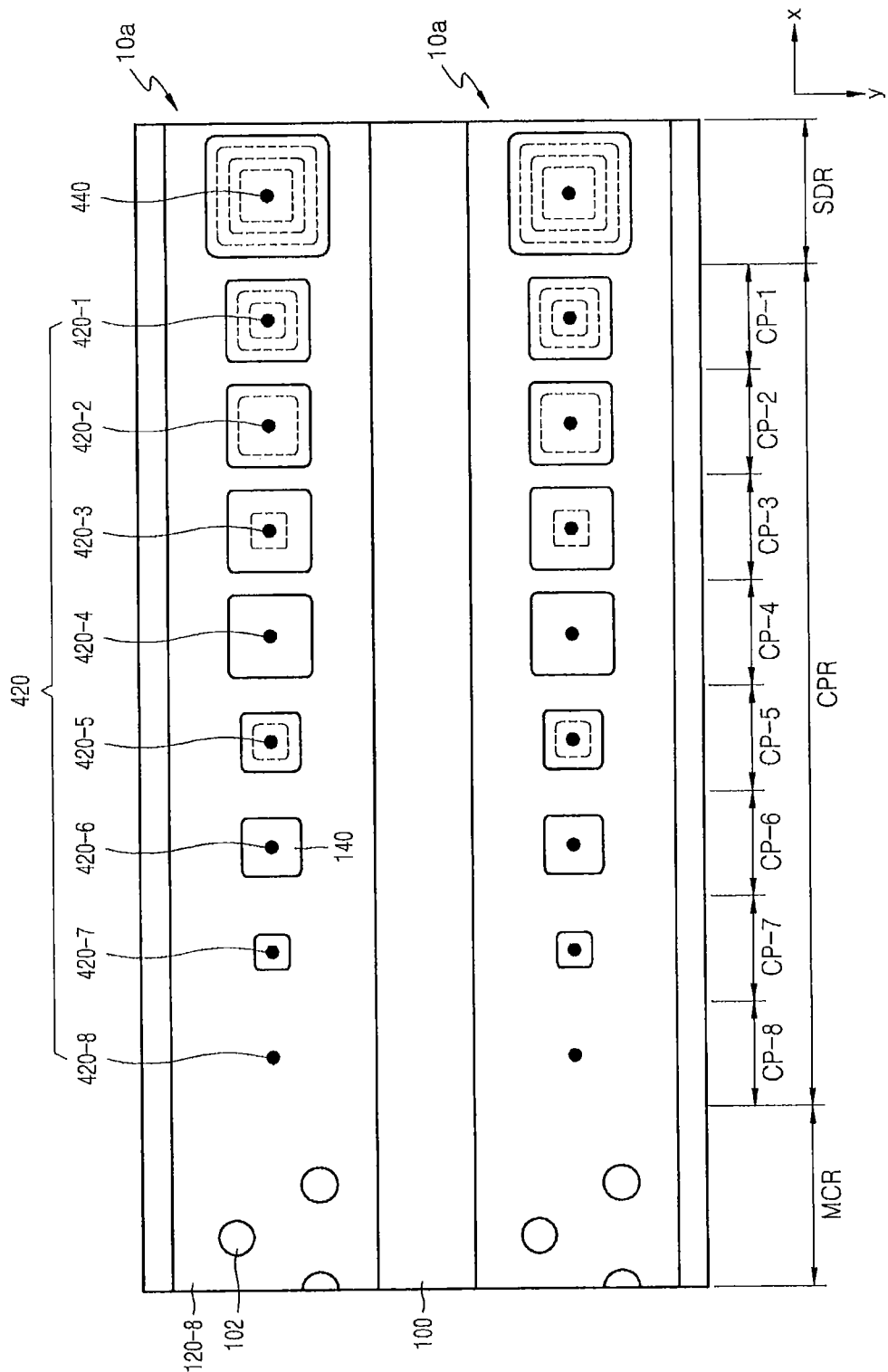
FIGS. 26 through 28 are plan views illustrating processes of forming a contact plug group according to some embodiments of the inventive concept.
Figure 27:
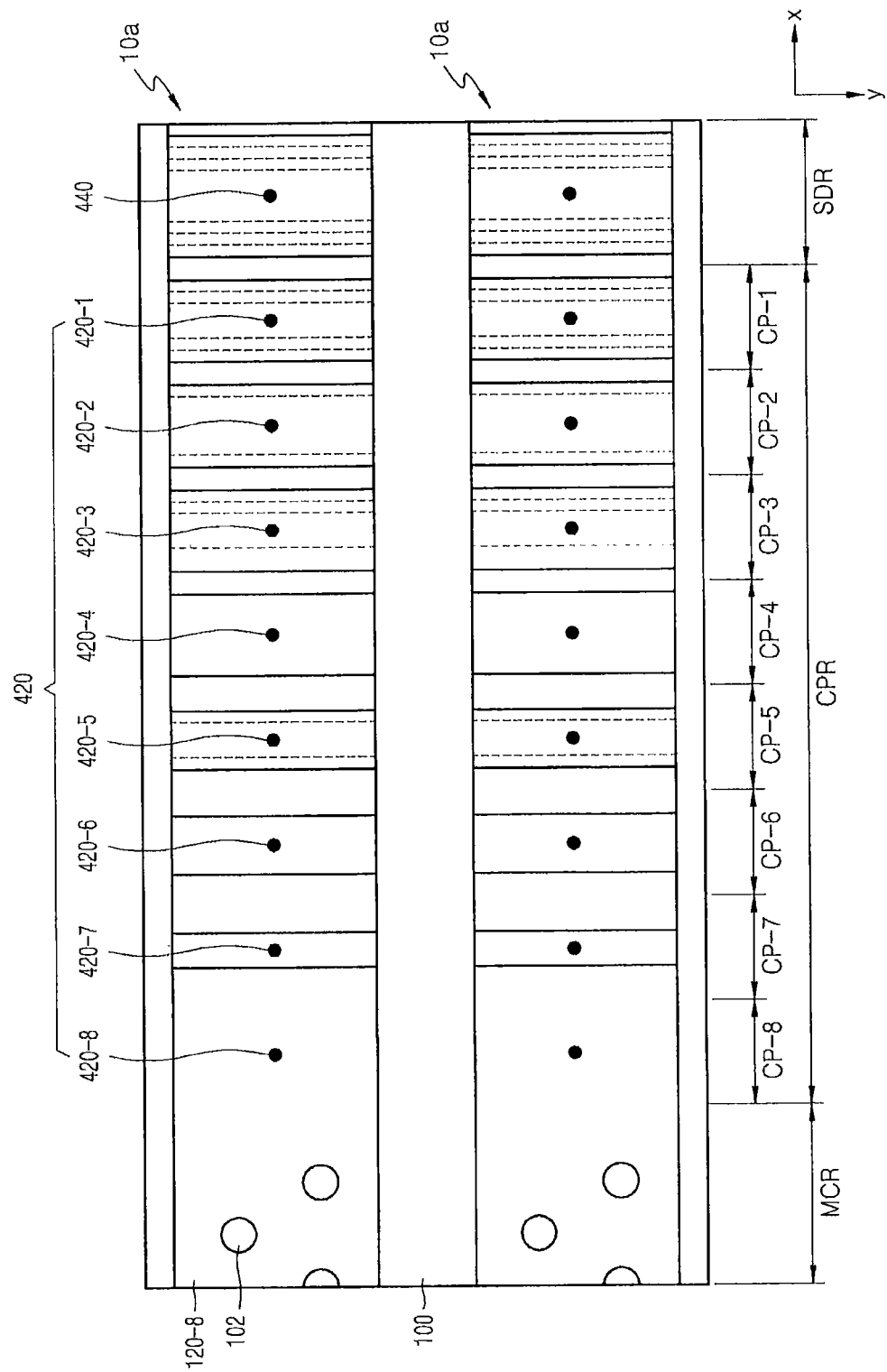
Figure 28:
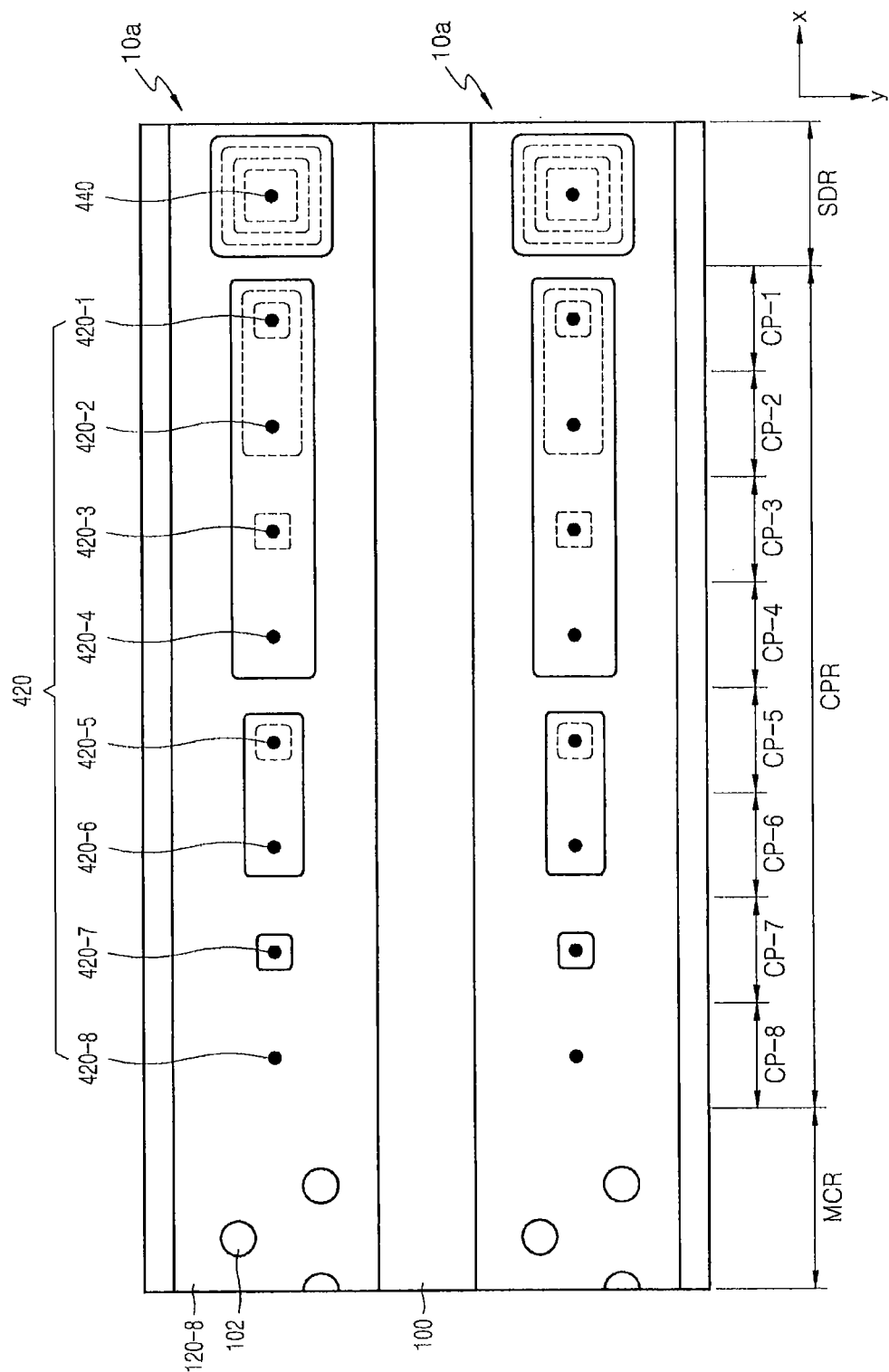

FIGS. 26 through 28 are plan views illustrating processes of forming a contact plug group 420 according to some embodiments of the inventive concept. In detail, FIGS. 26 through 28 are plan views illustrating processes of forming a contact plug group 420 corresponding to that illustrated in FIGS. 12, 13, and 19.

Referring to FIG. 26 through 28, the contact plug group 420 may be formed in each of divided stacked structures 10a. Sides of the contact plugs 420-1 through 420-8 included in the contact plug group 420 may be completely surrounded by the buried insulating layers 140 and the uppermost deposited insulating layer 120-8. Accordingly, one of the contact plugs 420-1 through 420-8 is connected to only a corresponding one of the first conductive materials 400-1 through 400-8, and may be electrically insulated from the others of the first conductive materials 400-1 through 400-8. Each of the contact plugs 420-1 through 420-8 may have a smaller cross-section than a minimum cross-section of each of the buried insulating layers 140.

Selectively, if the selection contact plug 440 is formed in the stack dividing region SDR, the selection contact plug 440 may be surrounded by the buried insulating layers 140 formed in the stack dividing region SDR.

FIGS. 29 through 33 are cross-sectional views illustrating processes of forming a contact plug group according to some embodiments of the inventive concept.

Figure 29:
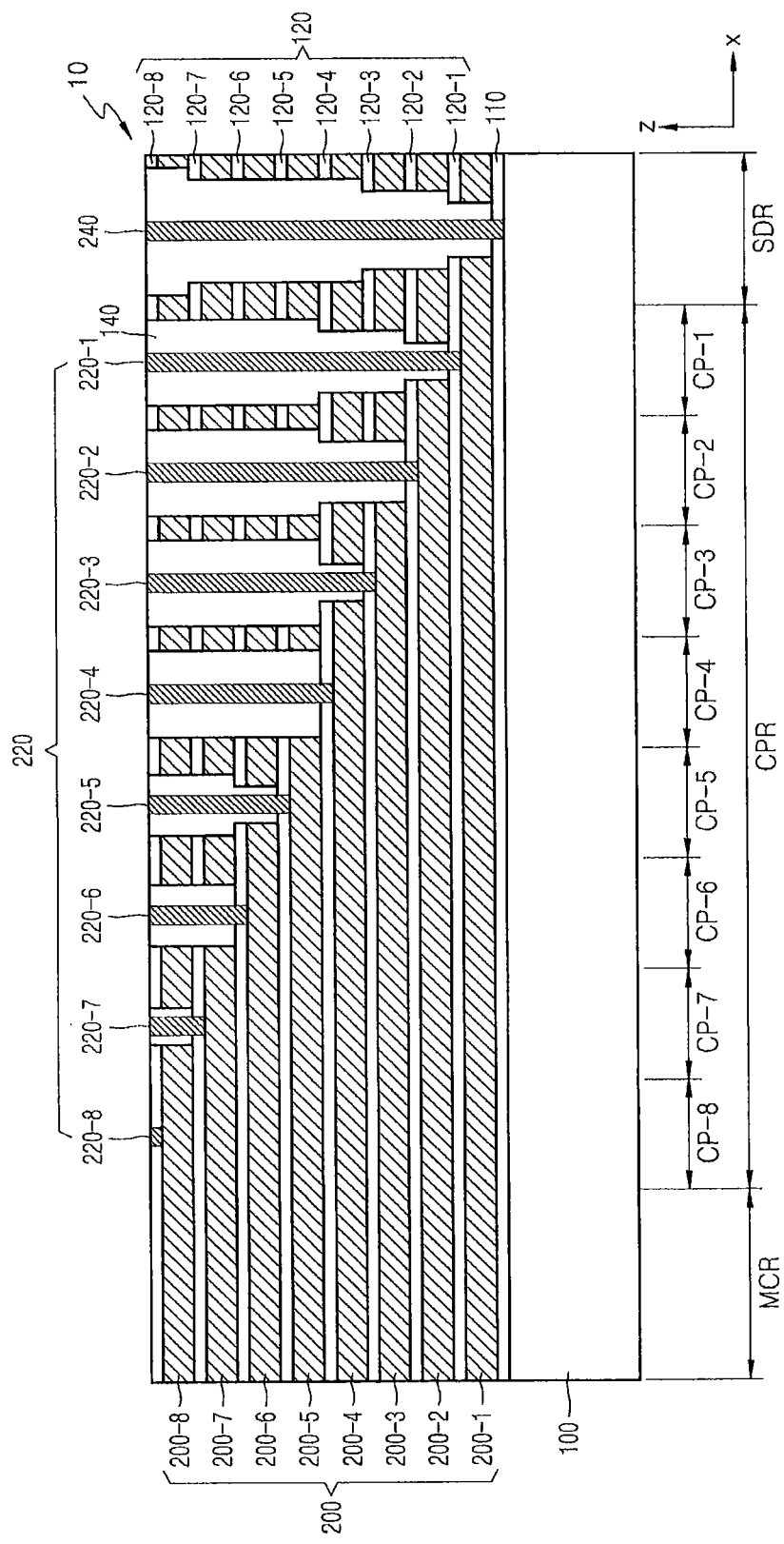
FIGS. 29 through 33 are cross-sectional views illustrating processes of forming a contact plug group according to some embodiments of the inventive concept.

FIG. 29 is a cross-sectional view illustrating a process of forming a sacrificial plug group 220 according to some embodiments of the inventive concept. In detail, FIG. 29 is a cross-sectional view illustrating operations corresponding to some embodiments of the inventive concept that may be performed before forming the divided stacked structure illustrated in FIG. 22.

Referring to FIG. 29, a plurality of sacrificial plugs 220-1 through 220-8 are formed. The sacrificial plugs 220-1 through 220-7 penetrate the buried insulating layers 140 and contact deposited sacrificial layers 200-1 through 200-7, respectively. The sacrificial plug 220-8 penetrates an uppermost deposited insulating layer 120-8 and contacts an uppermost deposited sacrificial layer 200-8. That is, the sacrificial plugs 220-1 through 220-8 penetrate the buried insulating layers 140 and deposited insulating layers 120-1 through 120-8 respectively, and may contact the deposited sacrificial layers 200-1 through 200-8 respectively. The sacrificial plugs 220-1 through 220-7 may have the same etch selectivity as or similar etch selectivities to those of the deposited sacrificial layers 200-1 through 200-8. The sacrificial plugs 220-1 through 220-7, for example, may include a nitride.

In the case where 2$^n$ deposited insulating layers 200-1 through 200-8 are formed, 2$^n$ or more sacrificial plugs 220-1 through 220-8 may be formed. The 2$^n$ sacrificial plugs 220-1 through 220-8 contacting the 2$^n$ deposited insulating layers 200-1 through 200-8 respectively may be called a sacrificial plug group 220.

That is, the sacrificial plug group 220 may include the 2$^n$ sacrificial plugs 220-1 through 220-8 contacting the 2$^n$ deposited sacrificial layers 200-1 through 200-8 respectively by penetrating the uppermost deposited insulating layer 120-8 of the 2$^n$ deposited insulating layers 120-1 through 120-8 and the 2$^n$−1 buried insulating layers 140.

Figure 30:
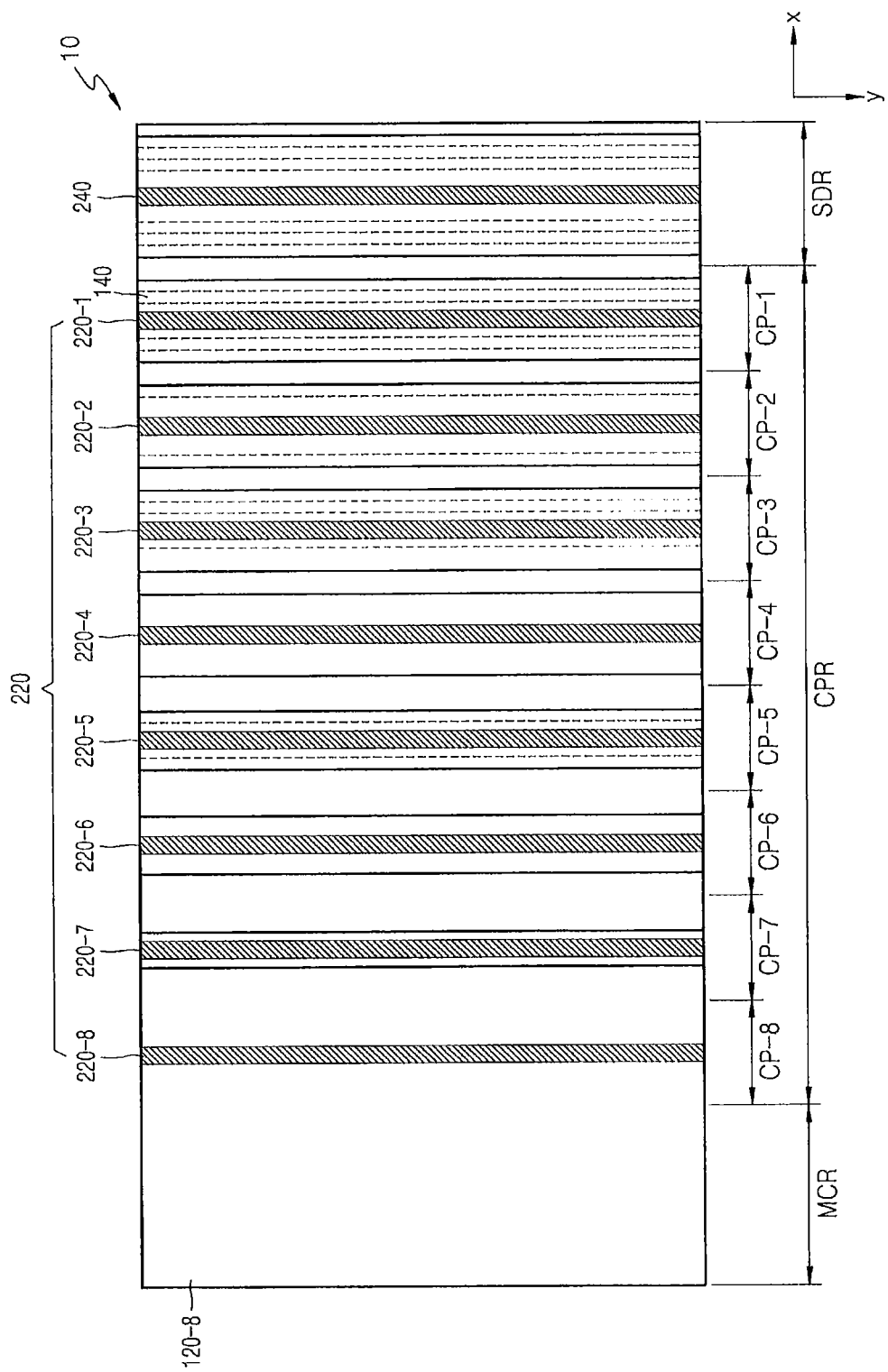

FIG. 30 is a plan view illustrating a process of forming a sacrificial plug group 220 according to some other embodiments of the inventive concept.

Referring to FIGS. 7, 13, and 30, first recesses R1 through R7 may be formed in a line shape extending in the second direction (the Y-axis direction) to form the sacrificial plug group 220. In addition, the sacrificial plugs 220-1 through 220-8 may be formed in a line shape extending in the second direction (the Y-axis direction). Sides of the sacrificial plugs 220-1 through 220-8 may be surrounded by the buried insulating layers 140 respectively.

Figure 31:
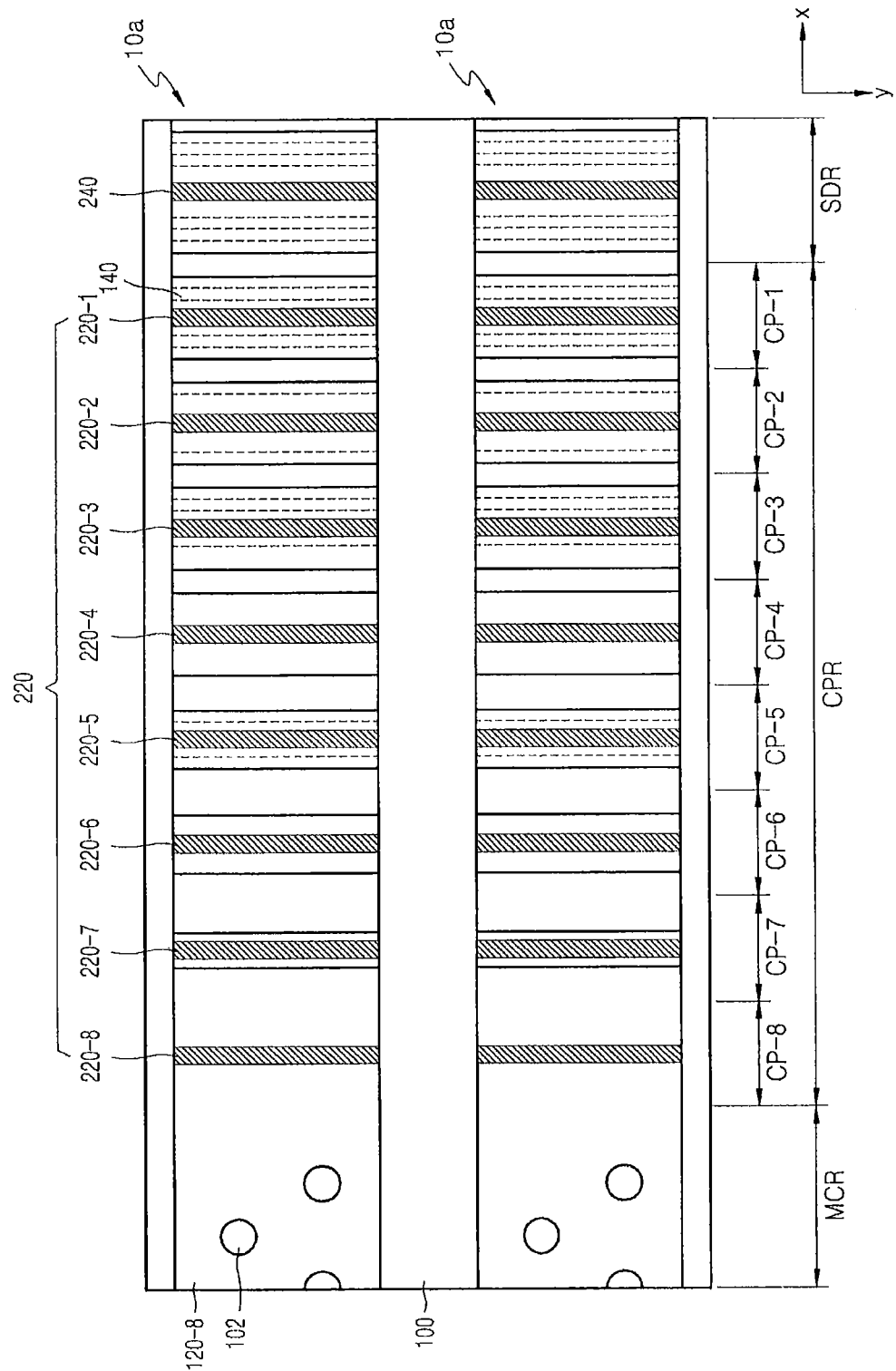

FIG. 31 is a cross-sectional view illustrating a process of forming a divided stacked structure 10a according to another embodiment of the inventive concept.

Referring to FIG. 31, the stacked structure 10 illustrated in FIG. 30 is divided into a plurality of divided stacked structures 10a extending in the first direction (the X-axis direction). A portion of the stacked structure 10 illustrated in FIG. 30 may be removed and a substrate 100 may be exposed in order to form the divided stacked structures 10a. Each of the divided stacked structures 10a may include a sacrificial plug group 220 and a buried insulating layer group 140. The divided stacked structures 10a may be formed after forming a channel region 102 and the buried insulating layer group 140.

Figure 32:
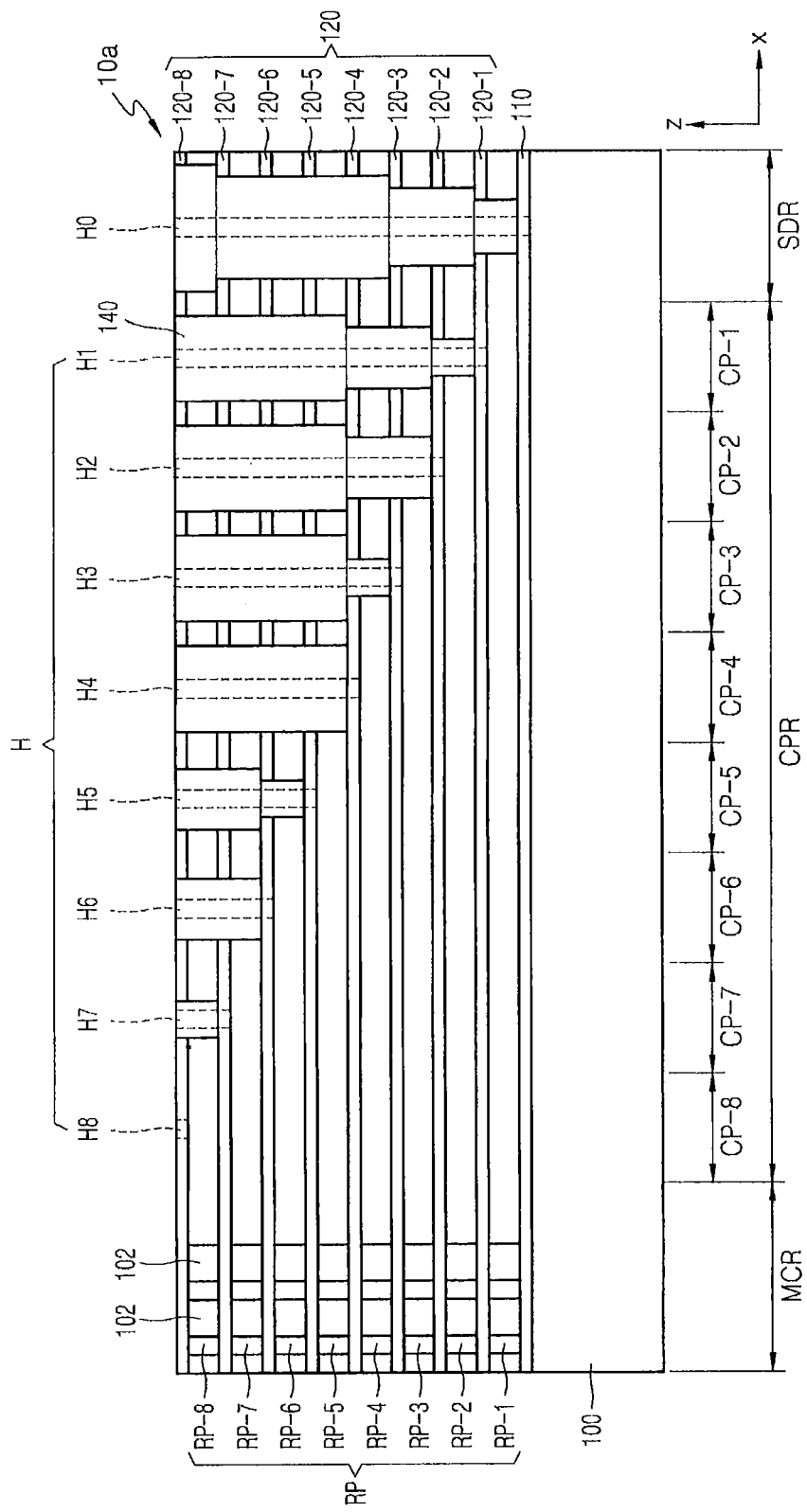

FIG. 32 is a perspective view in the second direction (the Y-axis direction), illustrating a process of removing deposited sacrificial layers 200 and sacrificial plugs 220, according to another embodiment of the inventive concept.

Referring to FIG. 32, the deposited sacrificial layers 200 and the sacrificial plug group 220 included in each of the divided stacked structures 10a illustrated in FIG. 32 are removed. For example, the isotropic etch process may be used to remove the deposited sacrificial layers 200 and the sacrificial plug group 220. Spaces in which the deposited sacrificial layers 200 are removed may be referred to as replacement spaces RP, and spaces in which the sacrificial plug group 220 is removed may be referred to as replacement holes H. Replacement spaces RP, namely, RP-1 through RP-8 correspond to spaces in which the deposited sacrificial layers 200, namely, 200-1 through 200-8 are removed, respectively. Replacement holes H, namely, H1 through H8 correspond to spaces in which the sacrificial plugs 220-1 through 220-8 are removed, respectively.

Figure 33:
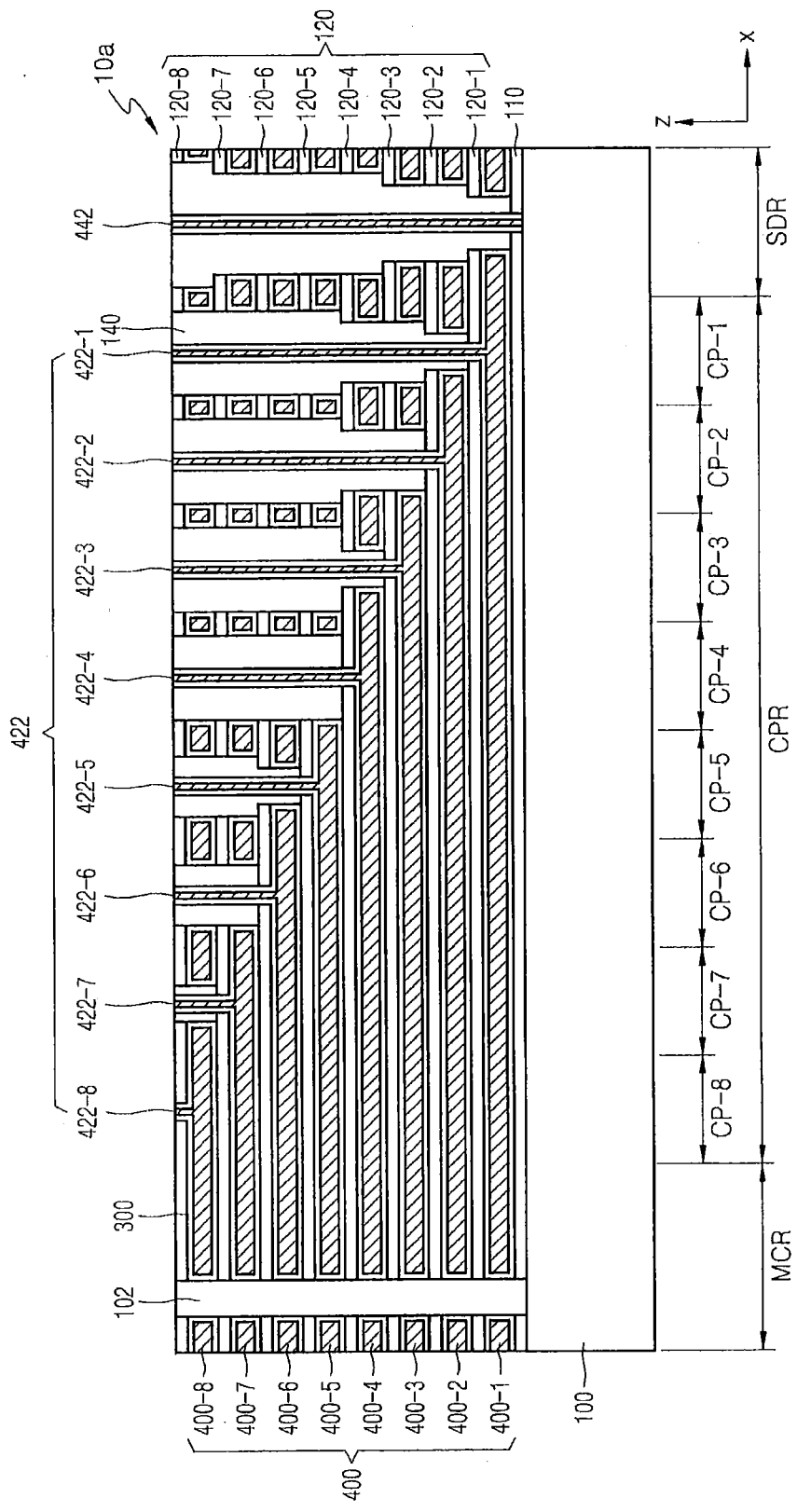

FIG. 33 is a cross-sectional view illustrating a process of forming conductive materials 400 and 422 according to some other embodiments of the inventive concept.

Referring to FIG. 33, the conductive materials 400 and 422 are formed in the replacement spaces RP and the replacement holes H illustrated in FIG. 32. Here, before forming conductive materials 400 and 422, a gate insulating film 300 may be formed on exposed surfaces. The gate insulating film 300 may include a tunneling insulating layer 310, a charge storing layer 320, and a blocking insulating layer 330, which are sequentially deposited. In particular, the tunneling insulating layer 310, the charge storing layer 320, and the blocking insulating layer 330 may be sequentially deposited on a sidewall of a channel region 102.

Portions 400-1 through 400-8 formed in the replacement spaces RP illustrated in FIG. 32, from among conductive materials 400 and 422 may function as gate electrodes of memory cells, namely, word lines or as selection lines of selection transistors. Portions 422-1 through 442-8 formed in the replacement holes H may function as contact plugs contacting the word lines or the selection lines.

Figure 34:
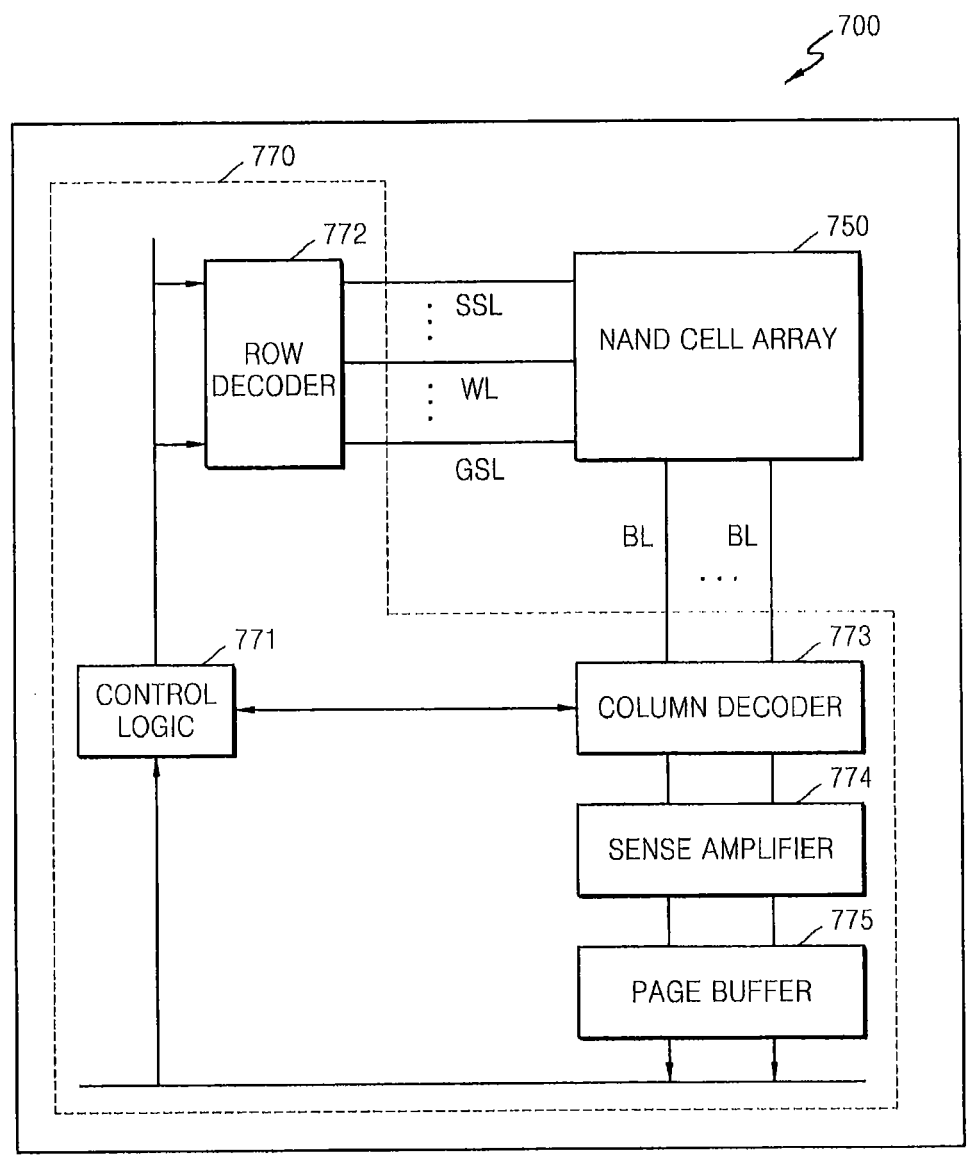
FIG. 34 is a block diagram of a non-volatile memory device according to some embodiments of the inventive concept.

FIG. 34 is a block diagram of a non-volatile memory device 700 according to some embodiments of the inventive concept.

Referring to FIG. 34, in the non-volatile memory device 700, a NAND cell array 750 may be coupled to a core circuit unit 770. The NAND cell array 750 may include one of semiconductor devices of FIG. 25 and FIG. 33. The core circuit unit 770 may include a control logic 771, a row decoder 772, a column decoder 773, a sense amplifier 774, and a page buffer 775.

The control logic 771 may communicate with the row decoder 772, the column decoder 773, and the page buffer 775. The row decoder 772 may communicate with the NAND cell array 750 through a plurality of string selection lines SSL, a plurality of word lines WL, and a plurality of ground selection lines GSL. The column decoder 773 may communicate with the NAND cell array 750 through a plurality of bit lines BL. The sense amplifier 774 may be connected to the column decoder 773 when a signal is output from the NAND cell array 750, and may not be connected to the column decoder 773 when a signal is transmitted to the NAND cell array 750.

For example, the control logic 771 may transmit a row address signal to the row decoder 772, and the row decoder 772 may decode the row address signal and then transmit a decoded row address signal to the NAND cell array 750 through the plurality of string selection lines SSL, the plurality of word lines WL, and the plurality of ground selection lines GSL. The control logic 771 may transmit a column address signal to the column decoder 773 or the page buffer 775, and the column decoder 773 may decode the column address signal and then transmit a decoded column address signal to the NAND cell array 750 through the plurality of bit lines BL. An output signal of the NAND cell array 750 may be transmitted to the sense amplifier 774 through the column decoder 773, and the sense amplifier 774 may amplify the output signal. A signal amplified in the sense amplifier 774 may be transmitted to the control logic 771 through the page buffer 775.

Figure 35:
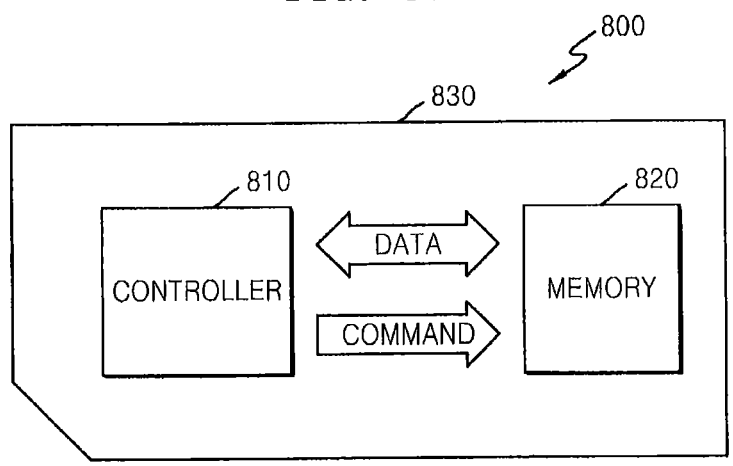
FIG. 35 is a schematic view illustrating a memory card according to some embodiments of the inventive concept.

FIG. 35 is a schematic view illustrating a memory card 800 according to some embodiments of the inventive concept.

Referring to FIG. 35, the memory card 800 may include a controller 810 and a memory 820, which are mounted on a housing 830. The controller 810 and the memory 820 may send/receive electric signals to/from each other. For example, the controller 810 and the memory 820 may send/receive data to/from each other, depending on a command of the controller 810. Accordingly, in the memory card 800, a data may be stored in the memory 820, or a data may be output from the memory 820 to an outside of the memory card.

The memory 820 may include one of the memory devices of FIG. 25 and FIG. 33 according to some embodiments of the inventive concept. The memory card 800 may be used as storage media of various portable devices. For example, the memory card 800 may be used in memory devices as a memory card, for example, such as a multi media card (MMC) or a secure digital (SD) card.

Figure 36:
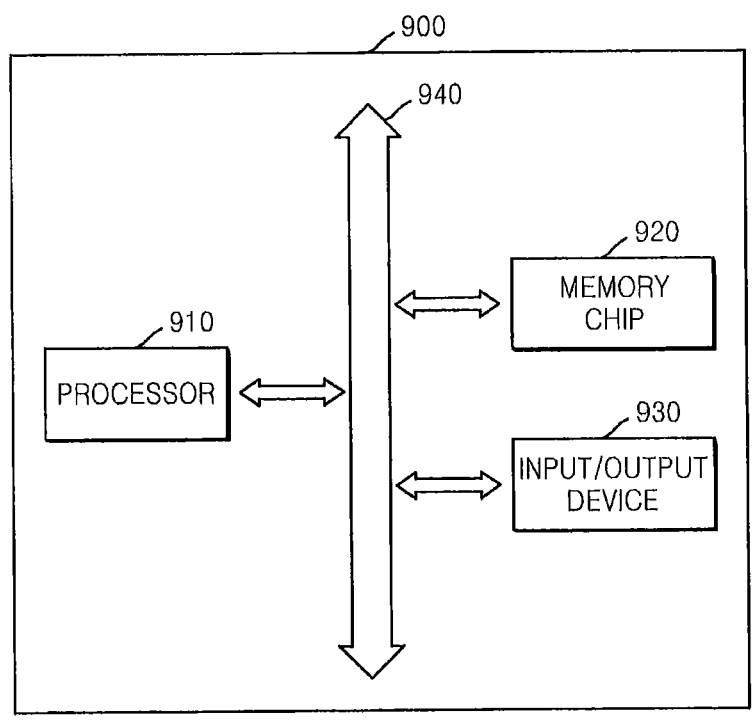
FIG. 36 is a block diagram of an electronic system according to some embodiments of the inventive concept.

FIG. 36 is a block diagram of an electronic system 900 according to some embodiments of the inventive concept.

Referring to FIG. 36, the electronic system 900 may include a processor 910, an input/output device 930, and a memory chip 920. The processor 910, the input/output device 930, and the memory chip 920 may communicate with each other through a bus 940. The processor 910 executes a software program and controls the electronic system 900. The input/output device 930 may be used to input or output data of the electronic system 900. The electronic system 900 is connected to an external apparatus, for example, a personal computer or a network, using the input/output device 930, to send/receive data to/from the external apparatus. The memory chip 920 may store codes and/or data for operating the processor 910. The memory chip 920 may include one of the memory devices of FIG. 25 and FIG. 33 according to the inventive concept.

The electronic system 900 may constitute various electronic control devices including the memory chip 920, and for example, may be used in a mobile phone, an MP3 player, a navigation system, a solid state disk (SSD), and/or a household appliance, among others.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A method of fabricating a semiconductor device, the method comprising:
   forming a stacked structure in which $2^n$ first material layers and $2^n$ second material layers are stacked on a substrate, each of the first material layers and each of the second material layers being alternately deposited on each other; and
   forming $2^n-1$ recesses penetrating a quantity of from $2^0$ to $2^n-1$ of the first material layers, respectively, so as that the $2^n-1$ recesses expose the quantity of $2^n-1$ of the first material layers from the substrate at bottoms of the recesses, respectively,
   wherein the $2^n-1$ recesses are formed by a combination of etch processes for penetrating $2^k$ first material layers, and
   wherein n is an integer that is greater than or equal to two and k is an integer in a range from 0 to n-1.

2. The method according to claim 1, wherein etch processes performed to penetrate a same number of the first material layers from among etch processes for forming the $2^n-1$ recesses are simultaneously performed.

3. The method according to claim 1, wherein portions of the stacked structure in which $2^{n-1}$ recesses of the $2^n-1$ recesses are to be formed are respectively removed in etch processes for forming the $2^n-1$ recesses.

4. A method of fabricating a semiconductor device, the method comprising:
   forming a stacked structure in which $2^n$ (here, n is an integer which is 2 or more) deposited sacrificial layers and $2^n$ deposited insulating layers disposed on the $2^n$ deposited sacrificial layers respectively are alternately deposited in a third direction that is perpendicular to a first direction and a second direction on a substrate having an upper surface extending in the first and second directions which are perpendicular to each other;
   forming a recess group including $2^n-1$ first recesses penetrating $2^0$ through $2^n-1$ deposited sacrificial layers, respectively, from an uppermost deposited sacrificial layer of the $2^n$ deposited sacrificial layers;
   forming a buried insulating layer group including $2^n-1$ buried insulating layers filling the $2^n-1$ first recesses respectively; and
   forming a contact plug group including $2^n$ contact plugs penetrating an uppermost deposited insulating layer of the $2^n$ deposited insulating layers and the $2^n-1$ buried insulating layers, respectively, wherein n is an integer that is at least 2, and wherein forming the recess group is performed by n etch processes to remove a portion of the stacked structure.

5. The method according to claim 4, further comprising:

after forming the buried insulating layer group, removing the $2''$ deposited sacrificial layers; and filling first conductive material in a portion of spaces in which the $2''$ deposited sacrificial layers are removed.

6. The method according to claim 5, wherein removing the $2''$ deposited sacrificial layers comprises:

dividing the stacked structure into a plurality of divided stacked structures extending in the first direction;

removing portions of the $2''$ deposited sacrificial layers included in the plurality of divided stacked structures; and filling the first conductive material in the spaces in which the $2''$ deposited sacrificial layers are removed, and wherein forming the contact plug group comprises forming a plurality of contact plug groups corresponding to the plurality of divided stacked structures, respectively.

7. The method according to claim 4, further comprising:

after forming the buried insulating layer group, forming a sacrificial plug group including $2''$ sacrificial plugs contacting the $2''$ deposited sacrificial layers, respectively, by penetrating the uppermost deposited insulating layer of the $2''$ deposited insulating layers and the $2''-1$ buried insulating layers, respectively; and removing the sacrificial plug group and the $2''$ deposited sacrificial layers, wherein forming the contact plug group comprises filling conductive material in a portion of spaces in which the $2''$ deposited sacrificial layers are removed and in a space in which the sacrificial plug group is removed.

* * * * *